(12) United States Patent
Kim et al.

(10) Patent No.: US 7,557,026 B2
(45) Date of Patent: Jul. 7, 2009

(54) CONTACT STRUCTURE AND METHOD OF FORMING THE SAME

(75) Inventors: Jong-Kyu Kim, Seoul (KR); Sang-Sup Jeong, Suwon-si (KR); Sung-Gil Choi, Yongin-si (KR); Kuk-Han Yoon, Yongin-si (KR); Bum-Soo Kim, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/711,118

(22) Filed: Feb. 27, 2007

(65) Prior Publication Data

US 2008/0096378 A1   Apr. 24, 2008

(30) Foreign Application Priority Data

Oct. 20, 2006  (KR) .................. 10-2006-0102193

(51) Int. Cl.
   *H01L 21/44* (2006.01)
(52) U.S. Cl. .................. 438/597; 257/E21.507; 257/E21.627
(58) Field of Classification Search .................. 438/639, 438/641, 597; 257/E21.507, E21.627
See application file for complete search history.

(56) References Cited

U.S. PATENT DOCUMENTS 7,238,994 B2 * 7/2007 Chen et al. .................. 257/379
2004/0033659 A1 * 2/2004 Seitz et al. .................. 438/243

FOREIGN PATENT DOCUMENTS

| KR | 1996-0026209 | 7/1996 |
| KR | 10-2005-0059475 | 6/2005 |
| KR | 10-2005-0089291 | 9/2005 |

* cited by examiner

*Primary Examiner*—Asok K Sarkar
(74) *Attorney, Agent, or Firm*—Harness Dickey & Pierce

(57) ABSTRACT

In a method of forming a contact structure, first and second conductive structures may be formed on a lower structure to be spaced from each other. An insulating layer may be formed on the lower structure to cover the first and second conductive structures. A first hole exposing the first conductive structure may be formed through the insulating layer. A spacer may be formed on a sidewall of the first hole. A first contact electrically coupled to the first conductive structure may be formed in the first hole having the sidewall on which the spacer is formed. A portion of the insulating layer located between the spacers may be removed to form a second hole exposing the second conductive structure. A second contact electrically coupled to the second conductive structure may be formed in the second hole.

8 Claims, 26 Drawing Sheets

FIRST DIRECTION
SECOND DIRECTION

SECOND DIRECTION

FIRST DIRECTION
SECOND DIRECTION

SECOND DIRECTION

FIRST
DIRECTION

FIRST
DIRECTION

CONTACT STRUCTURE AND METHOD OF FORMING THE SAME

PRIORITY STATEMENT

This application claims priority under 35 U.S.C. § 119 to Korean Patent Application No. 10-2006-0102193, filed on Oct. 20, 2006, in the Korean Intellectual Property Office (KIPO), the entire contents of which are incorporated herein by reference.

BACKGROUND

1. Field

Example embodiments relate to a method of forming a contact structure. Other example embodiments relate to a method of forming a contact structure electrically coupled between an upper conductor and a lower conductor through an insulator provided between the upper conductor and the lower conductor.

2. Description of the Related Art

In general, a semiconductor device may be classified as either a volatile memory device or a non-volatile memory device. Examples of the volatile memory device may include a dynamic random access memory (DRAM) device and a static random access memory (SRAM) device. Examples of the non-volatile memory device may include a read only memory (ROM) device and an electrically erasable programmable read only memory (EEPROM) device, e.g., a flash memory device.

The semiconductor devices may be commonly manufactured by performing a fabrication process for forming an electrical circuit on a silicon wafer used as a semiconductor substrate, an electrical die sorting (EDS) process for inspecting electrical characteristics of the semiconductor devices formed by the fabrication process, and a packaging process for packaging the semiconductor devices in epoxy resins and individuating the semiconductor devices.

The fabrication process may include a plurality of steps, e.g., a contact formation step. A photolithography process and an etching process may be performed in the contact formation process so that a contact structure electrically coupled between an upper conductor and a lower conductor may be formed through an insulating layer located between the lower conductor and the upper conductor.

As described above, the photolithography process and the etching process may be used in the contact formation process. A distance between contacts included in the contact structure may become narrower for forming the flash memory device that has an increased integration degree.

When the contacts of the flash memory device are formed by a conventional method, an electrical short may be generated between the contacts. Efficiently reducing the distance between the contacts may be difficult. A method of forming contacts capable of efficiently reducing a distance between the contacts becomes crucial to manufacture cutting-edge semiconductor devices.

SUMMARY

Example embodiments provide a method of forming a contact structure capable of reducing a distance between contacts included in the contact structure.

In accordance with example embodiments, there is provided a method of forming a contact structure. In the method, first and second conductive structures may be formed on a lower structure. The first and second conductive structures may be spaced apart from each other. A first insulating layer may be formed on the lower structure to cover the first and second conductive structures. A first hole, formed through the first insulating layer, may expose the first conductive structure. A spacer may be formed on a sidewall of the first hole. A first contact may be formed in the first hole having the sidewall on which the spacer is formed. The first contact may be electrically coupled to the first conductive structure. A portion of the first insulating layer located between the spacers may be removed to form a second hole exposing the second conductive structure. A second contact may be formed in the second hole. The second contact may be electrically coupled to the second conductive structure.

In order to form the spacer, a second insulating layer may be formed on the first insulating layer to fill the first hole. The second insulating layer may be then anisotropically etched. The spacer may cover the sidewall of the first conductive structure to electrically insulate the second conductive structure from the first conductive structure.

In accordance with example embodiments, there is provided a method of forming a contact structure. In the method, first and second conductive structures may be formed on a lower structure. The first conductive structures may be spaced apart from one another in a first direction. The second conductive structure may be formed between the first conductive structures. A first insulating layer may be formed on the lower structure to cover the first and second conductive structures. The first insulating layer may be transformed into a preliminary first insulating layer pattern having first holes each exposing the first conductive structures. Spacers may be formed on inner walls of the first holes, respectively. A first contact may be formed in the first hole having the inner wall on which the spacer is formed. The first contact may be electrically coupled to the first conductive structure. A portion of the preliminary first insulating layer pattern located between the spacers may be removed so that the preliminary first insulating layer pattern may be transformed into a first insulating layer pattern having a second hole exposing the second conductive structure. A second contact may be formed in the second hole to be electrically coupled to the second conductive structure.

The inner wall of the first hole may be spaced apart from a sidewall of the first conductive structure in the first direction and the second conductive structure may not be exposed through the first hole. In order to form the spacer, a second insulating layer may be formed on the preliminary first insulating layer pattern to fill the first hole. The second insulating layer may then be anisotropically etched. The spacer fills a space between the first conductive structure and the inner wall of the first hole.

In order to form the first contact, a first conductive layer may be formed on the preliminary first insulating layer pattern, the spacer and the first conductive pattern to fill the first hole. Mask layer patterns may be formed on the first conductive layer to extend in the first direction. The mask layer patterns may be spaced apart from one another in a second direction substantially perpendicular to the first direction by a width substantially smaller than a width of the first hole such that the spacer may be located under a sidewall of the mask layer pattern. The first conductive layer may be etched by using the mask layer pattern as an etching mask until the spacer is exposed to transform the first conductive layer into a first contact and a remaining pattern. The first contact fills the first hole having the inner wall on which the spacer is formed. The remaining pattern may be located under the mask layer pattern. The mask layer pattern may be removed from the remaining pattern.

The preliminary first insulating layer pattern may be transformed into the first insulating layer pattern by removing a portion of the preliminary first insulating layer pattern exposed between the remaining patterns and between the spacers until the lower structure and the second conductive pattern are exposed. In order to form the second contact, a second conductive layer may be formed on the lower structure, the second conductive structure, the first contact, the spacer and the remaining pattern to fill the second hole. A planarization process may be performed on the second conductive layer until the first insulating layer pattern is exposed.

In order to form the first contact, a first conductive layer may be formed on the preliminary first insulating layer pattern, the spacer and the first conductive pattern to fill the first hole. The first conductive layer may be planarized until the preliminary first insulating layer pattern and the spacer are exposed. In order to transform the preliminary first insulating layer pattern into the first insulating layer pattern, mask layer patterns may be formed on the preliminary first insulating layer pattern and the spacer to extend in the first direction. The mask layer patterns may be spaced apart form each other in a second direction substantially perpendicular to the first direction by a width substantially smaller than a width of the first hole such that the spacer is located under a sidewall of the mask layer pattern. A portion of the preliminary first insulating layer pattern exposed between the remaining patterns and between the spacers may be etched until the lower structure and the second conductive pattern is exposed to form the second hole.

In order to form the second contact, the mask layer patterns may be removed from the first insulating layer pattern. A second conductive layer may be formed on the second conductive layer on the lower structure, the second conductive structure, the first contact and the spacer to fill the second hole. A planarization process may be performed on the second conductive layer until the first contact, the spacer and the first insulating layer pattern may be exposed.

According to example embodiments, a contact structure may include first and second conductive structures on a lower structure, the first conductive structures being spaced apart from one another in a first direction, a first insulating layer on the lower structure to cover the first and second conductive structures, spacers on inner walls of a first hole in the first insulating layer, a first contact electrically coupled to the first conductive structure, and a second contact electrically coupled to the second conductive structure.

The second conductive structure may be between the first conductive structures. The contact structure may further include a second insulating layer on the first insulating layer to fill the first hole. The spacer may cover the sidewall of the first conductive structure to electrically insulate the second conductive structure from the first conductive structure. The inner wall of the first hole may be spaced apart from a sidewall of the first conductive structure in the first direction and the second conductive structure may not be exposed through the first hole.

The conductive structure may further include a first conductive layer on the first insulating layer, the spacer and a first conductive pattern, and mask layer patterns on the first conductive layer to extend in the first direction, the mask layer patterns being spaced apart from each other in a second direction substantially perpendicular to the first direction by a width substantially smaller than a width of the first hole such that the spacer is located under a sidewall of the mask layer pattern. The conductive structure may further include a second conductive layer on the lower structure, the second conductive structure, the first contact, the spacer and a remaining pattern.

According to example embodiments, a contact structure may include first and second contacts. In order to form the contact structure, the first contacts having sidewalls, on which spacers are formed, may be formed. The second contact electrically insulated from the first contact by the spacer may be formed between the first contacts. A distance between the first contact and the second contact may be efficiently reduced.

BRIEF DESCRIPTION OF THE DRAWINGS

Example embodiments will be more clearly understood from the following detailed description taken in conjunction with the accompanying drawings.

FIGS. 1, 3, 5, 7, 9, 11, 14, 17, 20 and 23 are plan views illustrating a method of forming a contact structure in accordance with example embodiments;

FIGS. 2, 4, 6, 8, 10, 12, 15, 18, 21 and 24 are cross-sectional views taken along lines I-I' in FIGS. 1, 3, 5, 7, 9, 11, 14, 17, 20 and 23, respectively;

FIGS. 13, 16, 19, 22 and 25 are cross-sectional views taken along lines II-II' in FIGS. 11, 14, 17, 20 and 23, respectively;

FIGS. 26, 28, 31, 34, 37 and 40 are plan views illustrating a method of forming a contact structure in accordance with example embodiments;

FIGS. 27, 29, 32, 35, 38 and 41 are cross-sectional views taken along lines I-I' in FIGS. 26, 28, 31, 34, 37 and 40, respectively; and FIGS. 30, 33, 36, 39 and 42 are cross-sectional views taken along lines II-II' in FIGS. 28, 31, 34, 37 and 40, respectively.

DESCRIPTION OF EXAMPLE EMBODIMENTS

Figure 1:
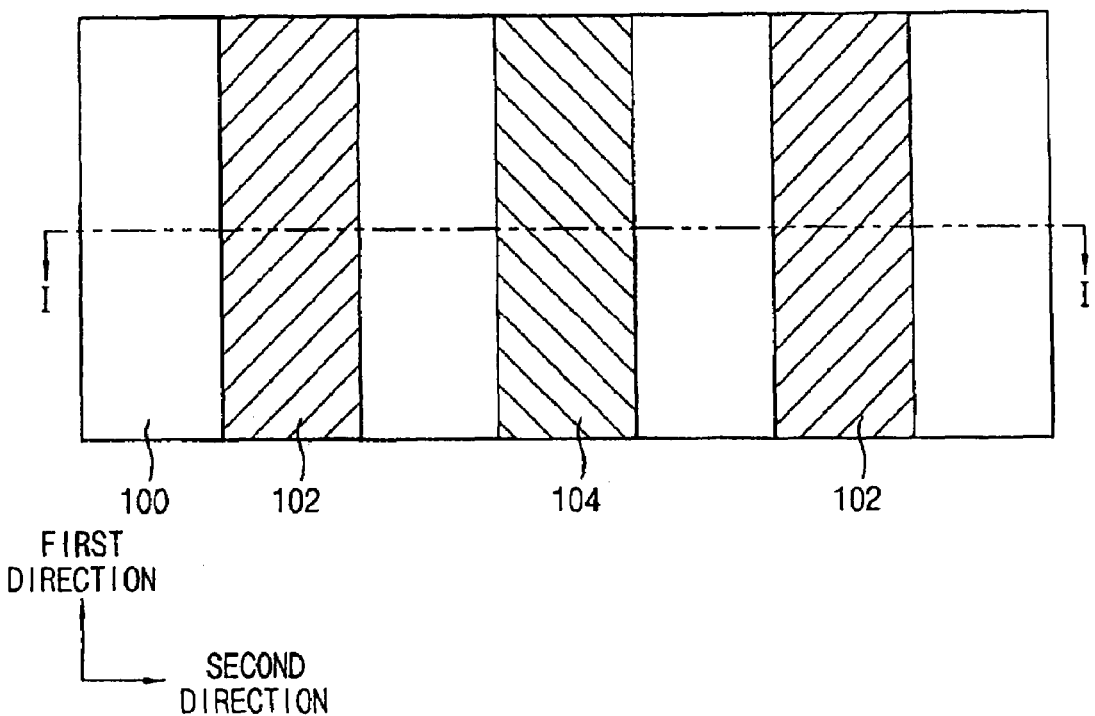
FIGS. 1-42 represent non-limiting, example embodiments as described herein.

Example embodiments will be described with reference to the accompanying drawings. Example embodiments may, however, be embodied in many different forms and should not be construed as limited to the embodiments set forth herein. Rather, the embodiments are provided so that disclosure of example embodiments will be thorough and complete, and will fully convey the scope of example embodiments to those skilled in the art. The principles and features of example embodiments may be employed in varied and numerous embodiments without departing from the scope of example embodiments. In the drawings, the size and relative sizes of layers and regions may be exaggerated for clarity. The drawings are not necessarily to scale. Like reference numerals designate like elements throughout the drawings.

It will also be understood that when an element or layer is referred to as being "on," "coupled to" and/or "coupled to" another element or layer, the element or layer may be directly on, coupled and/or coupled to the other element or layer or intervening elements or layers may be present. In contrast, when an element is referred to as being "directly on," "directly coupled to" and/or "directly coupled to" another element or layer, no intervening elements or layers are present. As used herein, the term "and/or" may include any and all combinations of one or more of the associated listed items.

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of example embodiments.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of example embodiments. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Example embodiments are described with reference to cross-section illustrations that are schematic illustrations of idealized embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of example embodiments.

FIGS. 1, 3, 5, 7, 9, 11, 14, 17, 20 and 23 are plan views illustrating a method of forming a contact structure in accordance with example embodiments. FIGS. 2, 4, 6, 8, 10, 12, 15, 18, 21 and 24 are cross-sectional views taken along lines I-I' in FIGS. 1, 3, 5, 7, 9, 11, 14, 17, 20 and 23, respectively.

Figure 2:
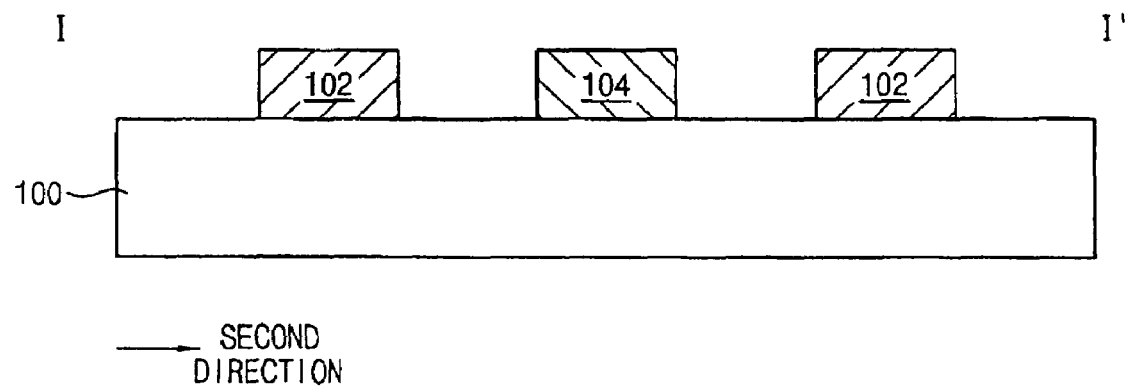

Referring to FIGS. 1 and 2, first and second conductive structures 102 and 104 may be formed on a lower structure 100 including an insulating material. The first and second conductive structures 102 and 104 may be formed using a conductive material, e.g., metal, metal nitride and/or doped polysilicon. The first and second conductive structures 102 and 104 may extend in a first direction on the lower structure 100. The first conductive structure 102 may be spaced apart from the second conductive structure 104 in a second direction substantially perpendicular to the first direction. The first and second conductive structures 102 and 104 may be alternately arranged.

Figure 3:
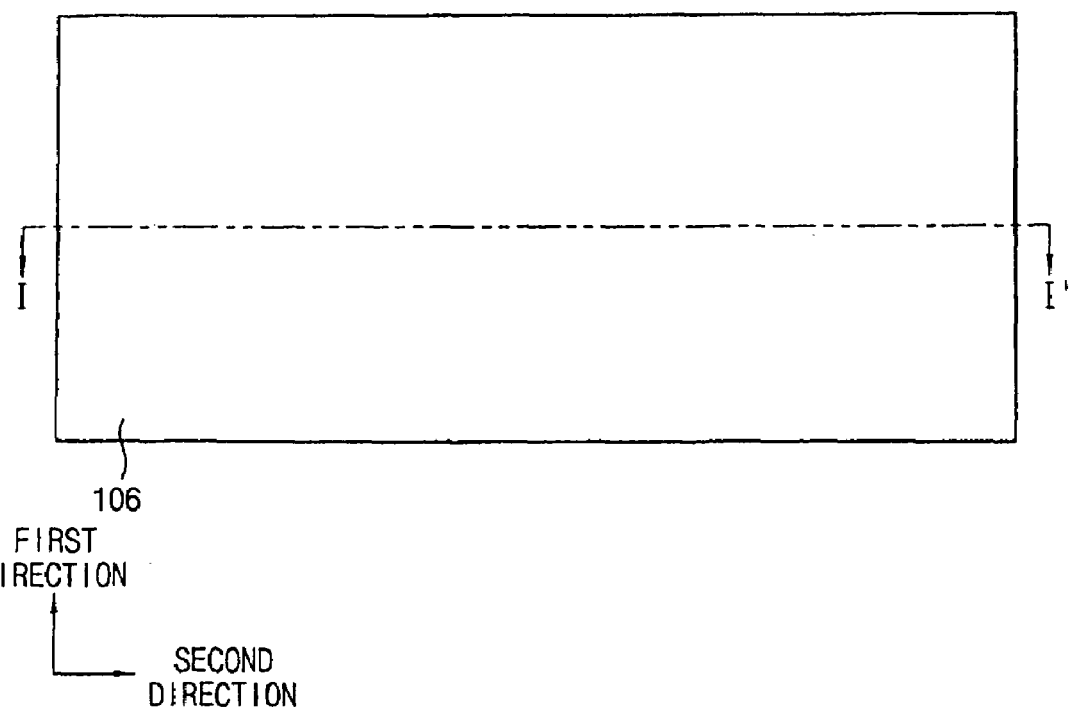
Figure 4:
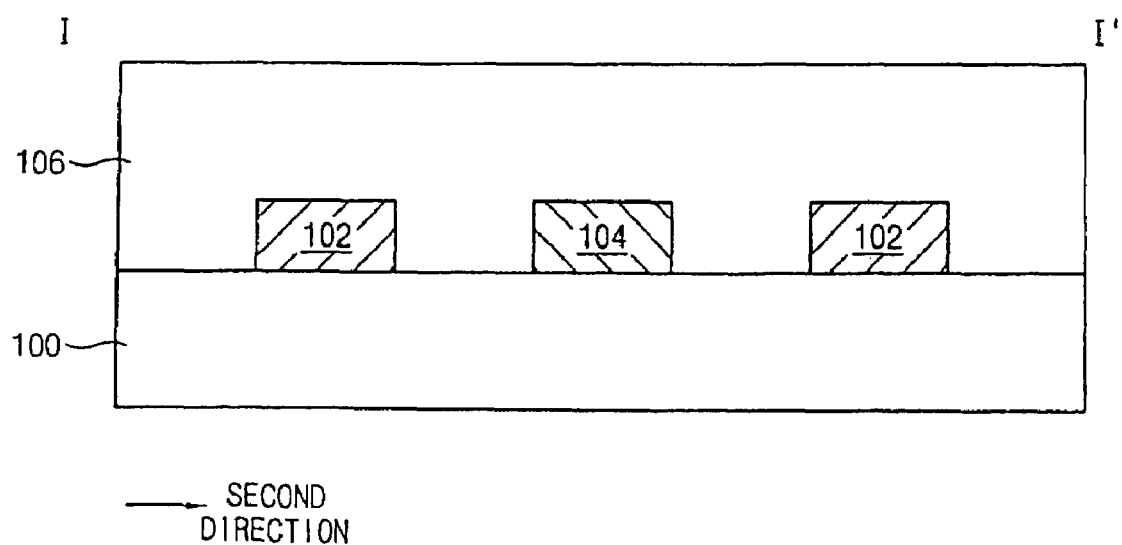

As illustrated in FIG. 1, shapes of the first and second conductive structures 102 and 104 may be substantial bar shapes. Many variations of the shapes of the first and second conductive structures 102 and 104 may be possible. For example, the first and second conductive structures 102 and 104 may have substantially cylindrical shapes. Referring to FIGS. 3 and 4, a first insulating layer 106 may be formed on the lower structure 100 to cover the first and second conductive structures 102 and 104. The first insulating layer 106 may include a first insulating material. For example, the first insulating layer 106 may be formed by a deposition process, e.g., a chemical vapor deposition (CVD) process.

Figure 5:
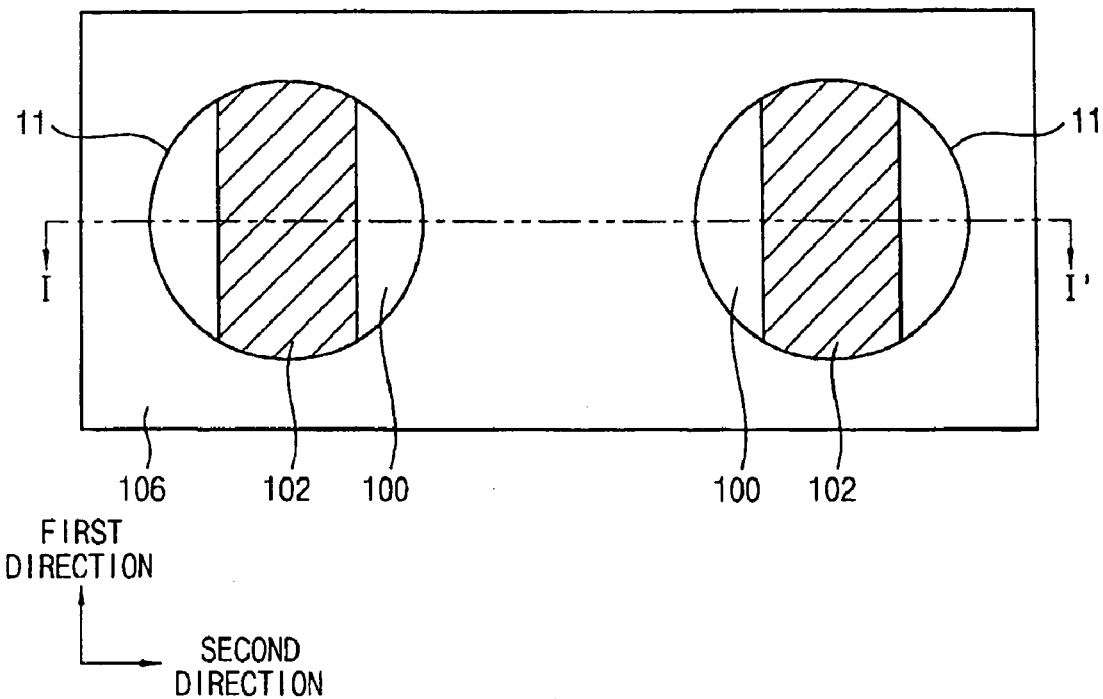
Figure 6:
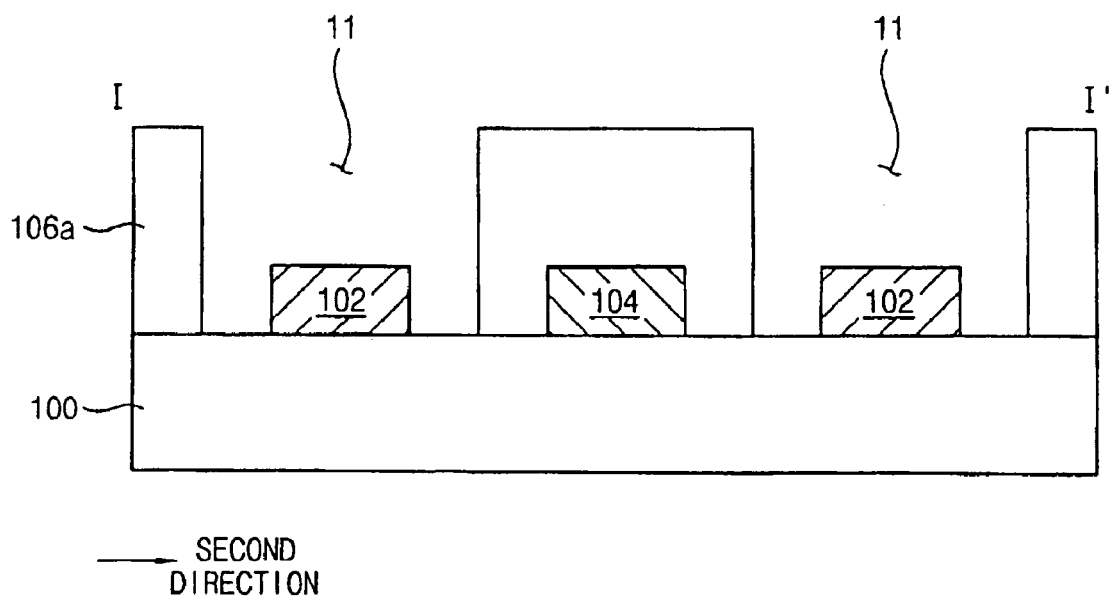

Referring to FIGS. 5 and 6, the first insulating layer 106 may be partially etched until the lower structure 100 is exposed. The first insulating layer 106 may be transformed into a preliminary first insulating layer pattern 106a having a first hole 11. The first hole 11 may partially expose the first conductive structure 102. An inner wall of the first hole 11 may be spaced apart from a sidewall of the first conductive structure 102 by a predetermined or given distance D. The second conductive structure 104 may not be exposed through the first hole 11.

Figure 7:
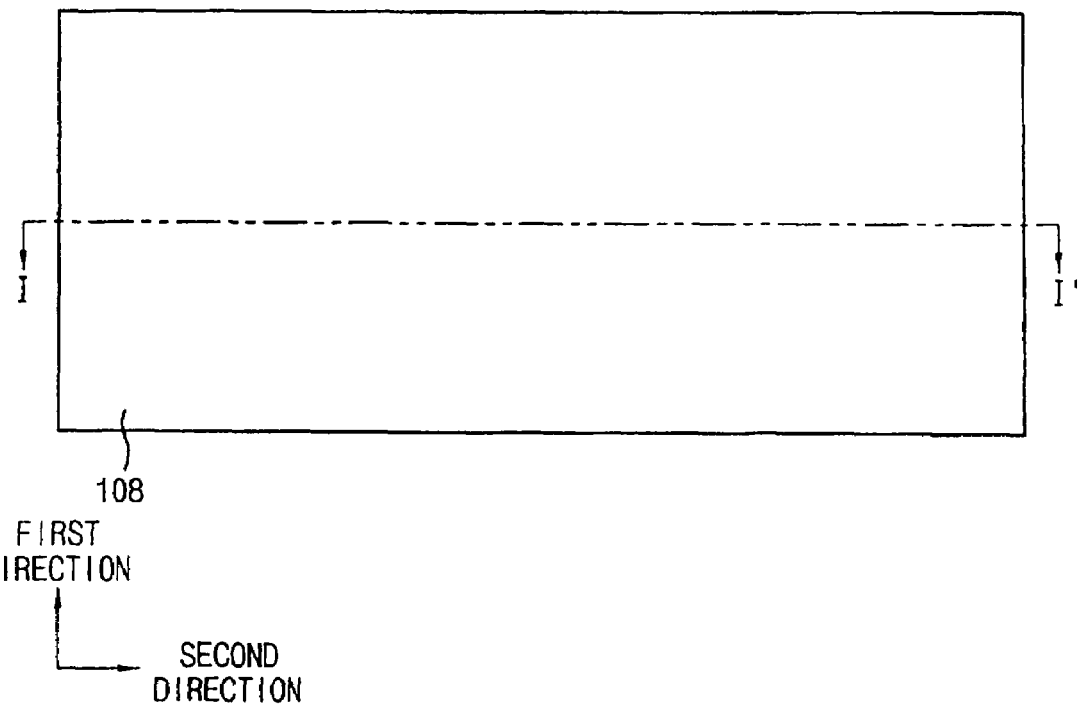
Figure 8:
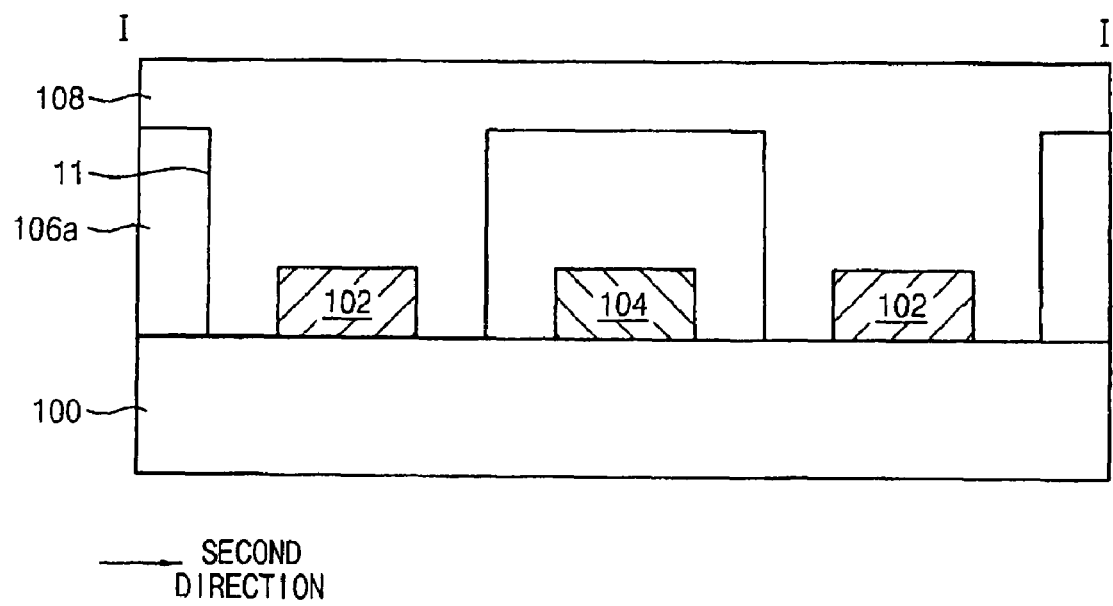

Referring to FIGS. 7 and 8, a second insulating layer 108 may be formed on the preliminary first insulating layer pattern 106a to fill the first hole 11. The second insulating layer 108 may include a second insulating material. The second insulating material may have an etching selectivity with respect to the first insulating material included in the first insulating layer 106. As one example, when the first insulating material is silicon oxide, the second insulating material may be silicon nitride. As another example, when the first insulating material is silicon nitride, the second insulating material may be silicon oxide.

Figure 9:
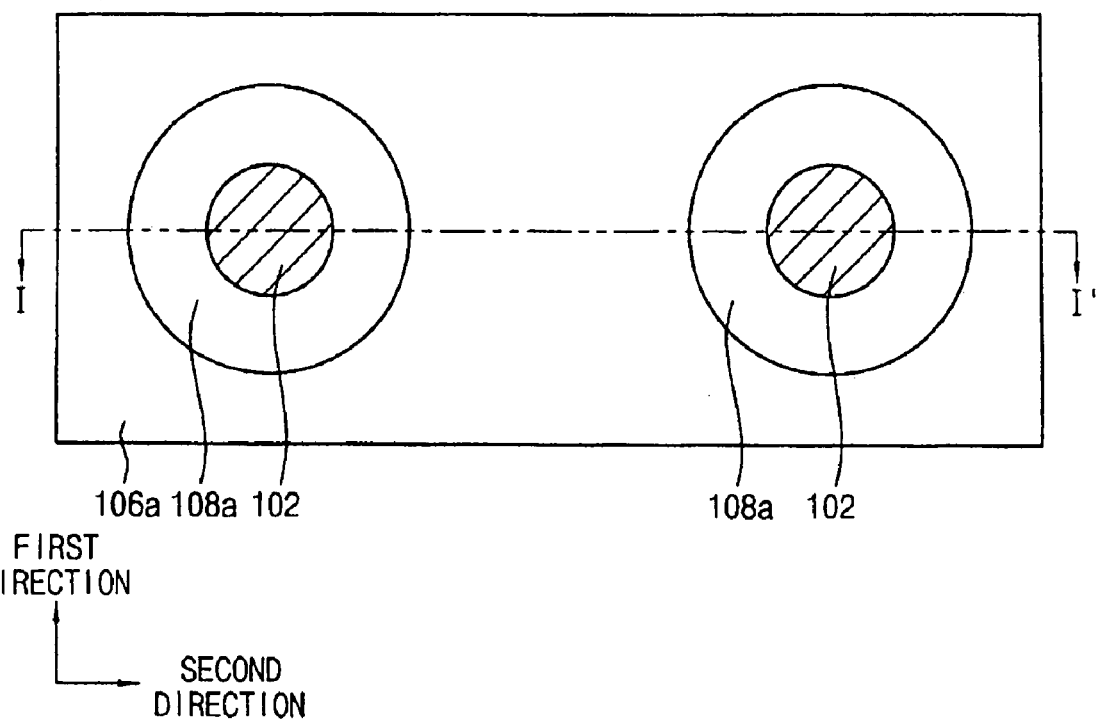
Figure 10:
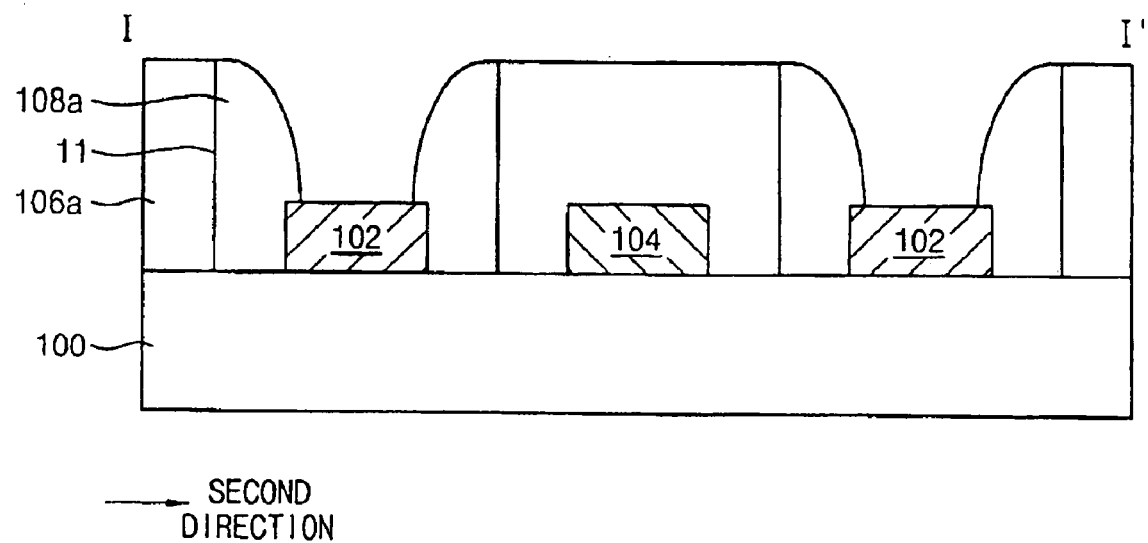

Referring to FIGS. 9 and 10, the second insulating layer 108 may be anisotropically etched. The second insulating layer 108 may be transformed into a spacer located on a sidewall of the first hole 11. As described above, the first insulating material may have the etching selectively with respect to the second insulating material. The preliminary first insulating layer pattern 106a may be hardly etched when the second insulating layer 108 is etched. The spacer 108a may fill a space between the first conductive structure 102 and the sidewall of the first hole 11. A lower portion of the spacer 108a may be larger than an upper portion of the spacer 108a. The spacer 108a may be formed by anisotropically etching the second insulating layer 108.

Figure 11:
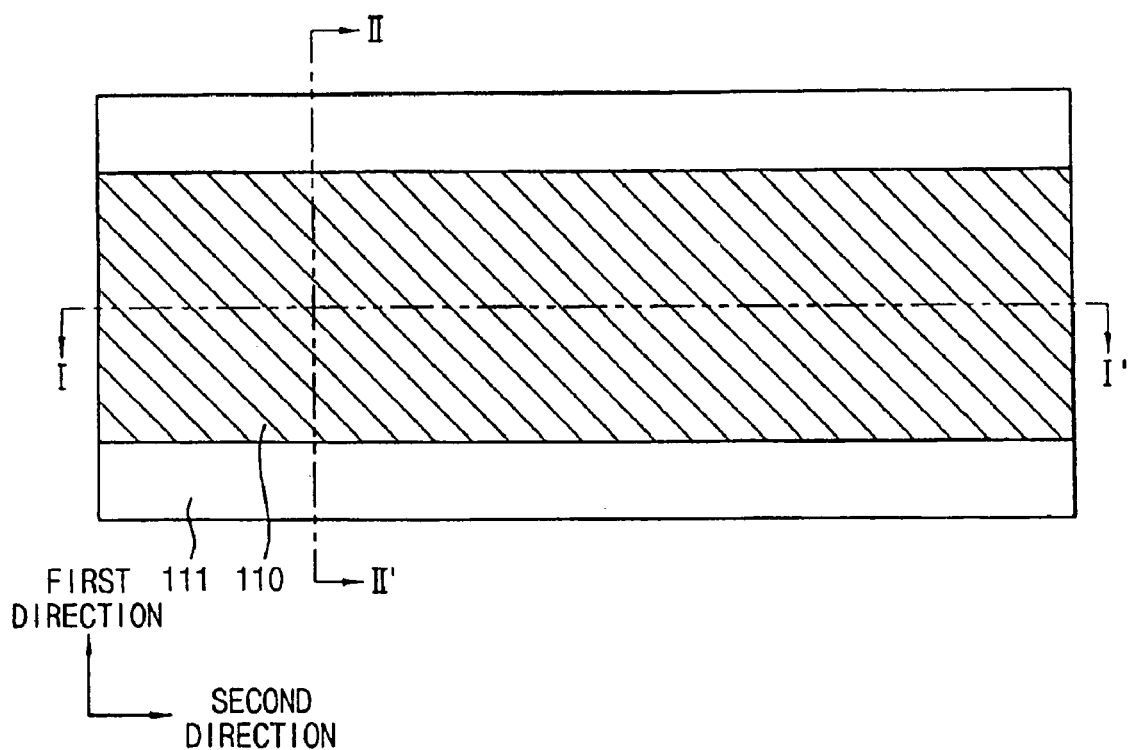
Figure 12:
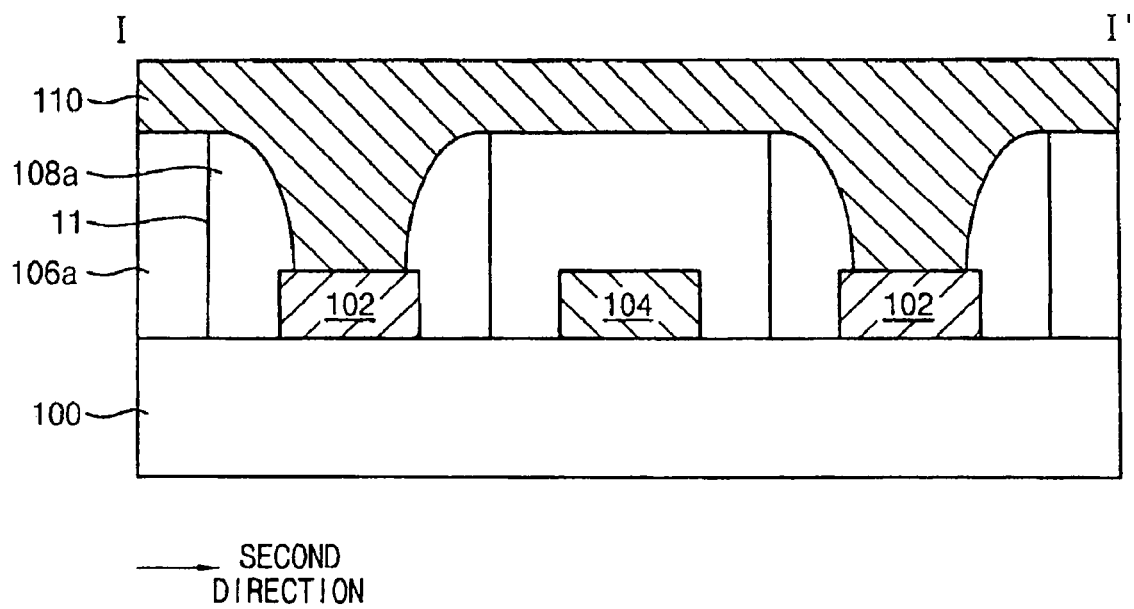
Figure 13:
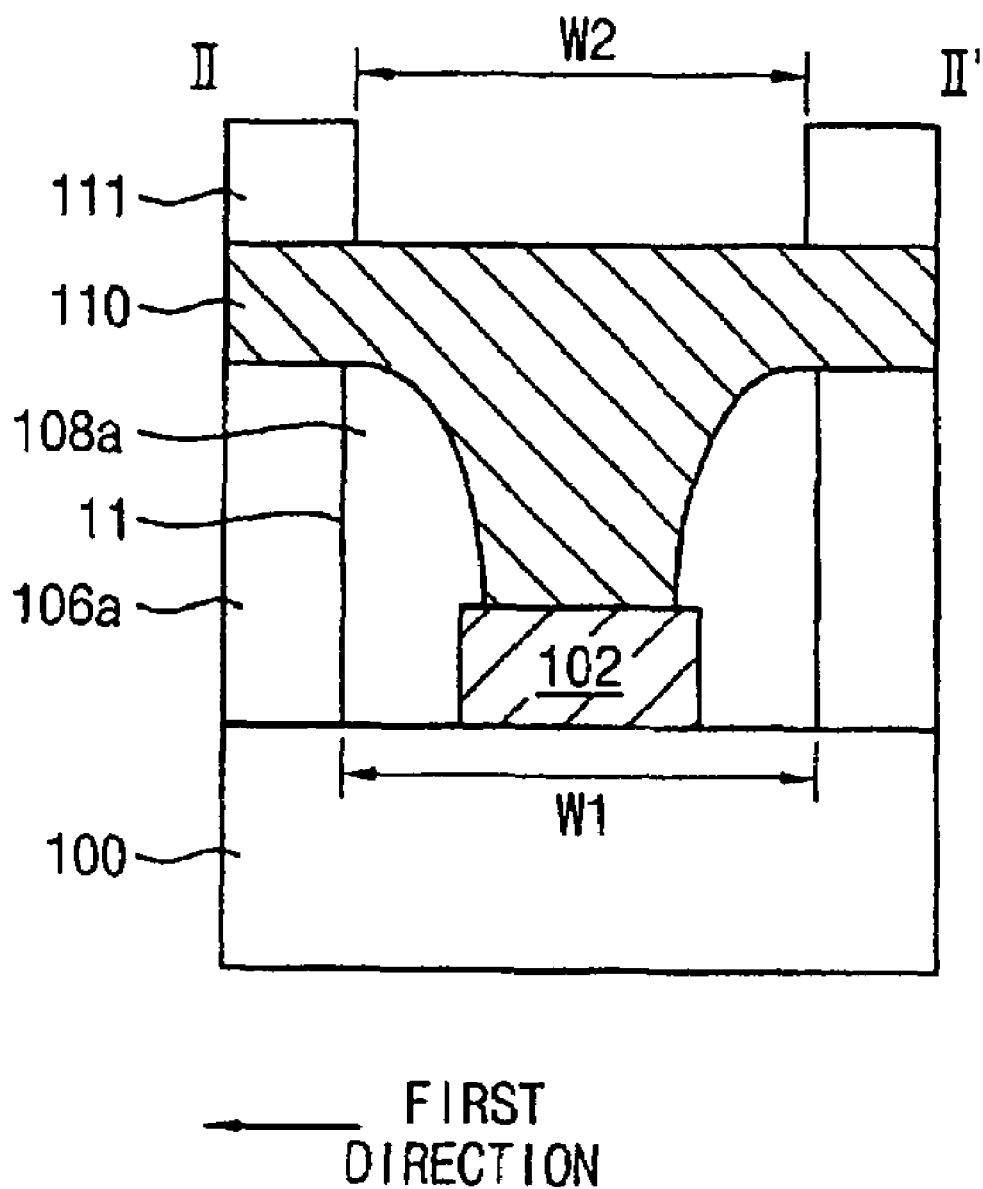

Referring to FIGS. 11, 12 and 13, a first conductive layer 110 may be formed on the preliminary first insulating layer pattern 106a, the spacer 108a and the first conductive pattern 102 to fill the first hole 11. The first conductive layer 110 may include a conductive material, e.g., metal and/or doped polysilicon. For example, the first conductive layer 110 may be formed by a physical deposition process and/or a chemical vapor deposition process. After the first conductive layer 110 is formed, mask layer patterns 111 extending in the second direction may be formed on the first conductive layer 110. As illustrated in FIG. 13, the mask layer patterns 111 may be spaced apart from each other by a second width W2 substantially less than a first width W1 of the first hole 11. The spacer 108a may be located under a sidewall of the mask layer pattern 111.

Figure 14:
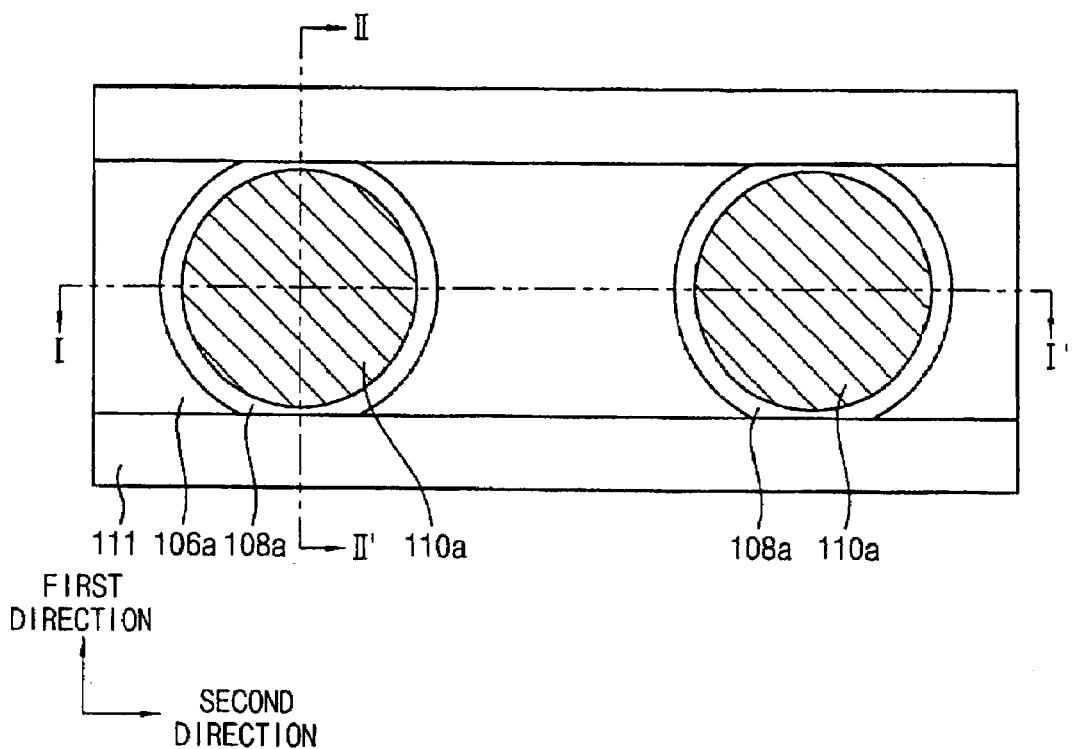
Figure 15:
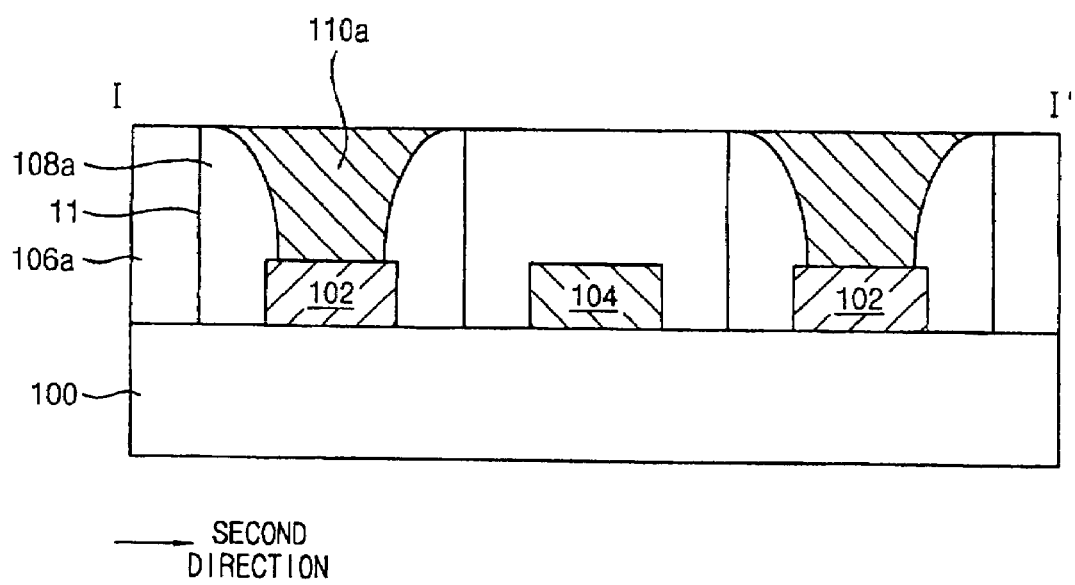
Figure 16:
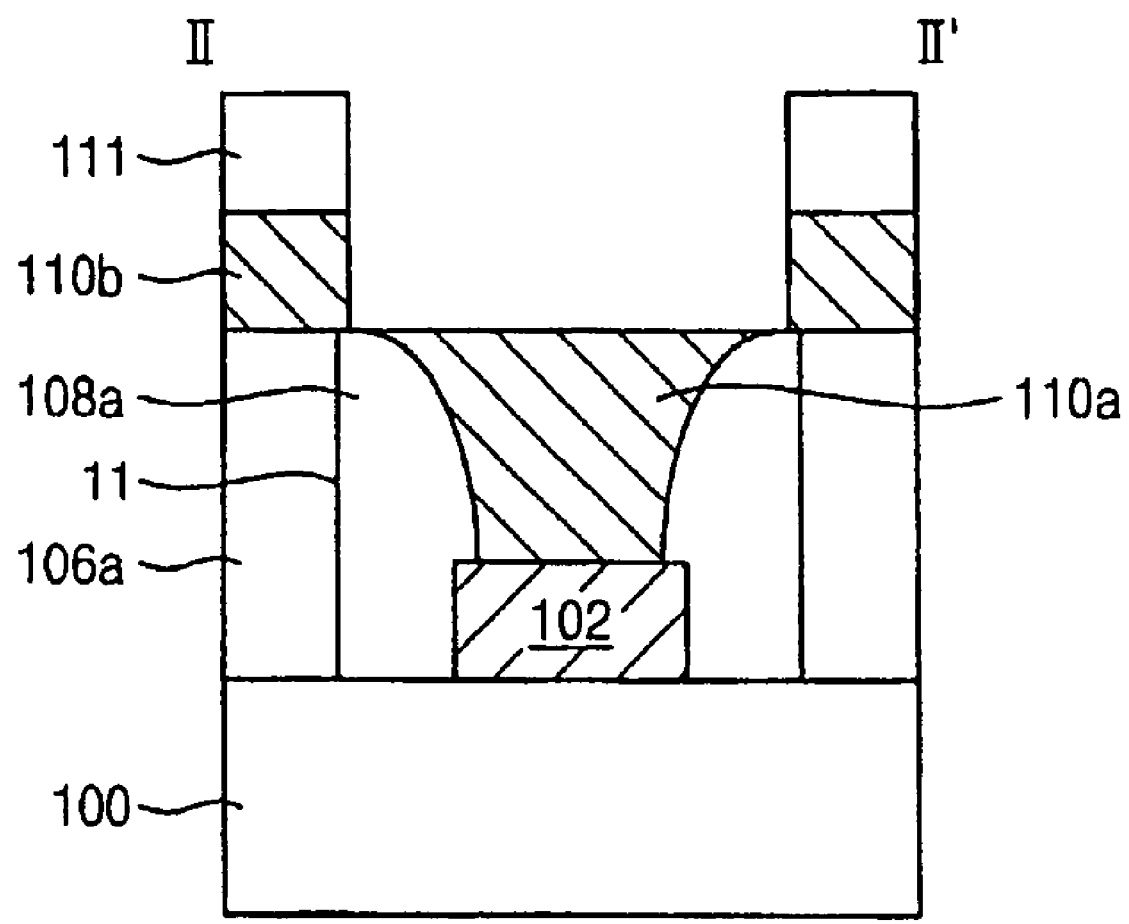

Referring to FIGS. 14, 15 and 16, the first conductive layer 110 may be etched using the mask layer pattern 111 as an etching mask until the spacer 108a is exposed. The first conductive layer 110 may be transformed into a first contact 110a and a remaining pattern 110b. The first contact 110a may fill the first hole 11 having the sidewall on which the spacer 108a is formed. The remaining pattern 110b may be formed under the mask layer pattern 111. As described above, the spacer 108a may be located under the sidewall of the mask layer pattern 111. The first contact 110a may not be coupled to the remaining pattern 110b.

Figure 17:
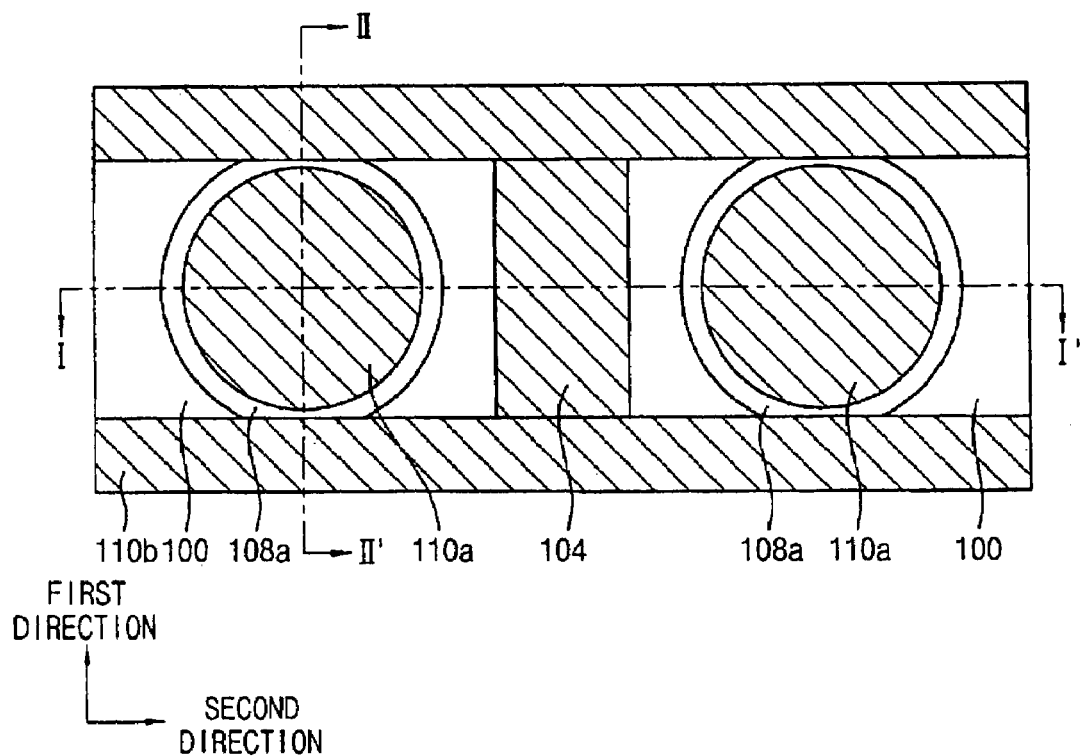
Figure 18:
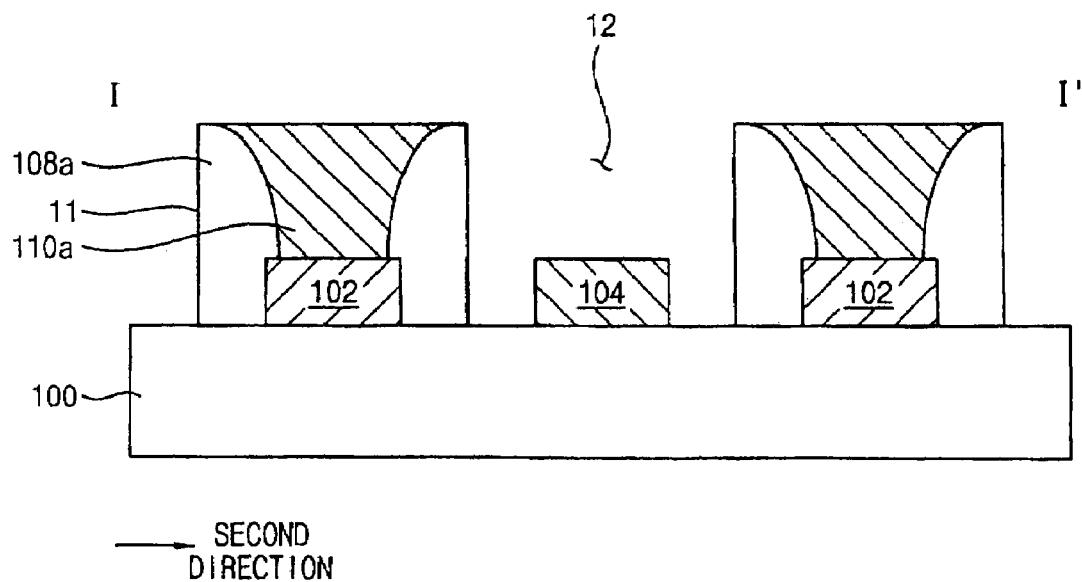
Figure 19:
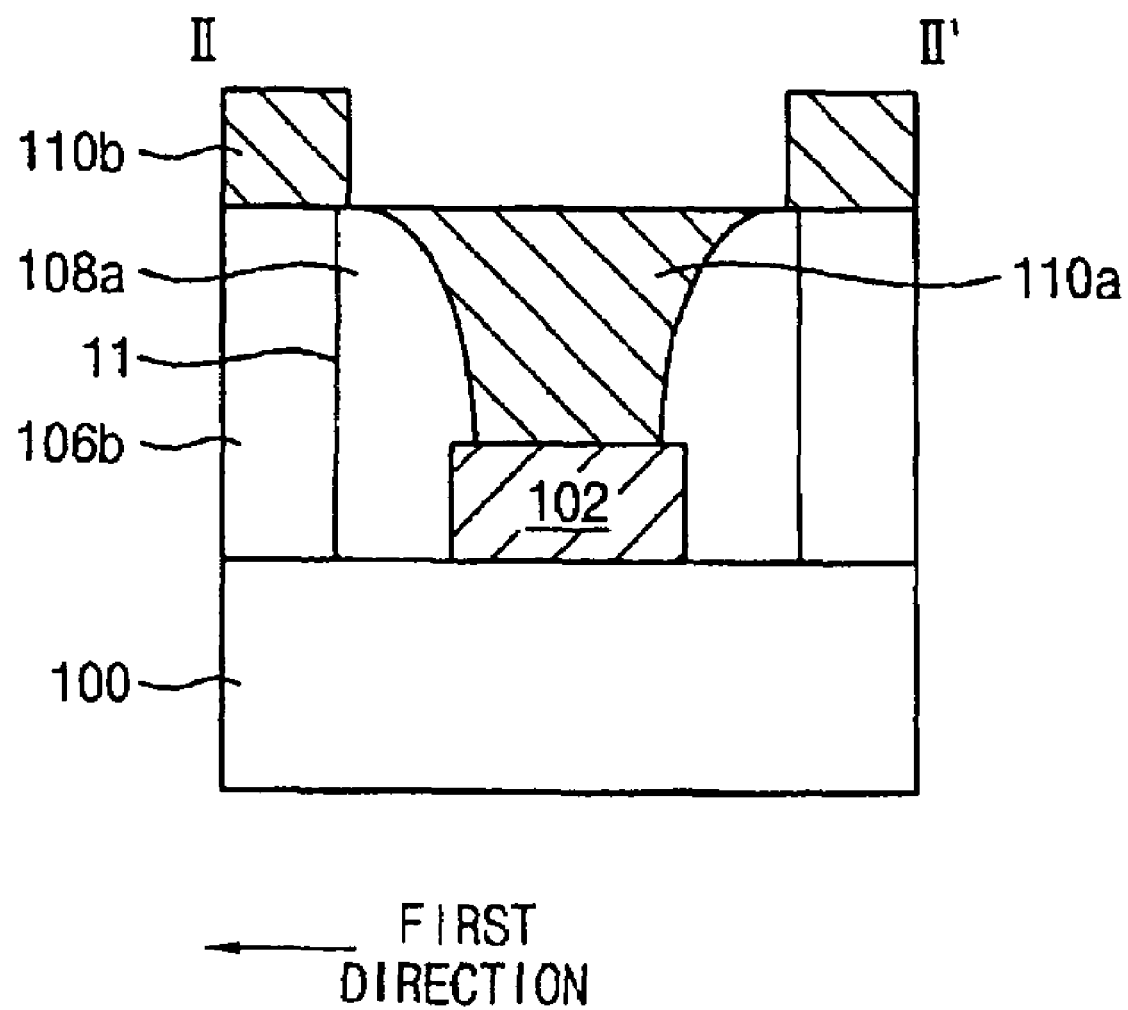

Referring to FIGS. 17, 18 and 19, the mask layer pattern 111 may be removed from the remaining pattern 110b. When the mask layer pattern 111 is a photoresist pattern, the mask layer pattern 111 may be removed by an ashing process and/or a stripping process. These processes may be used alone and/or in a combination thereof. A portion of the preliminary first insulating layer pattern 106a exposed between the remaining patterns 110b and the spacers 108a may be removed until the lower structure 100 and the second conductive pattern 104 are exposed. The preliminary first insulating layer pattern 106a may be transformed into a first insulating layer pattern 106b having a second hole 12. The first insulating layer pattern 106b may be located under the remaining pattern 110b.

Figure 20:
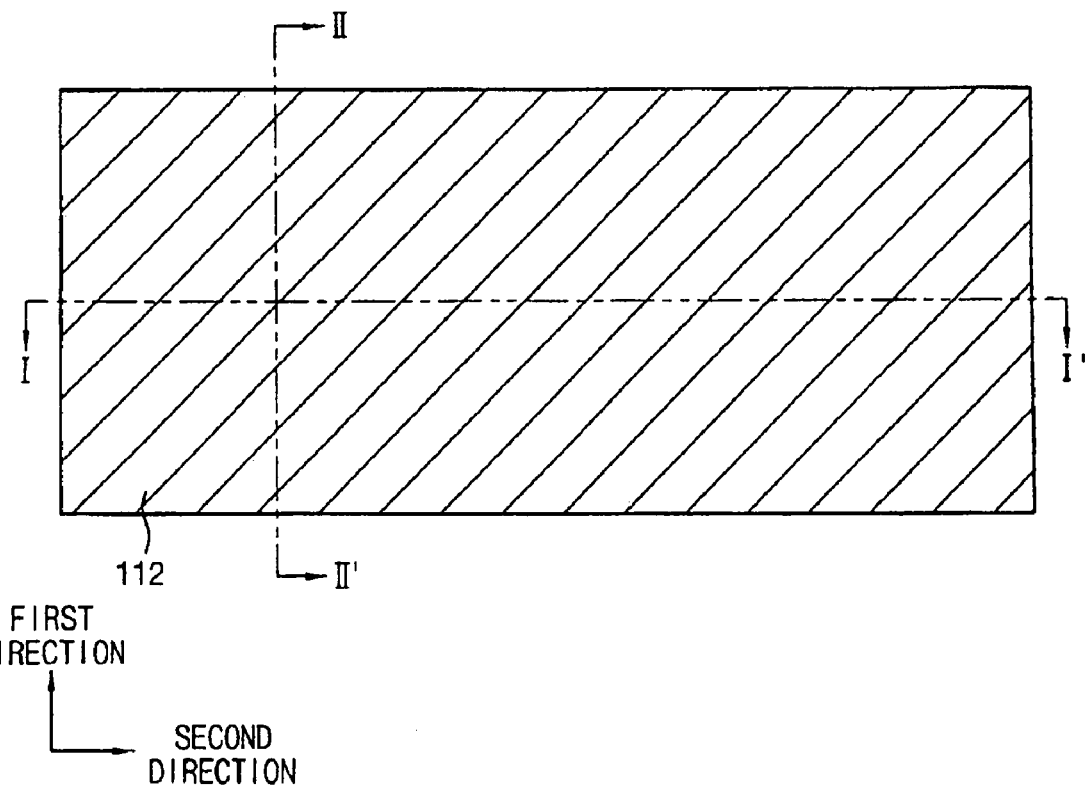
Figure 21:
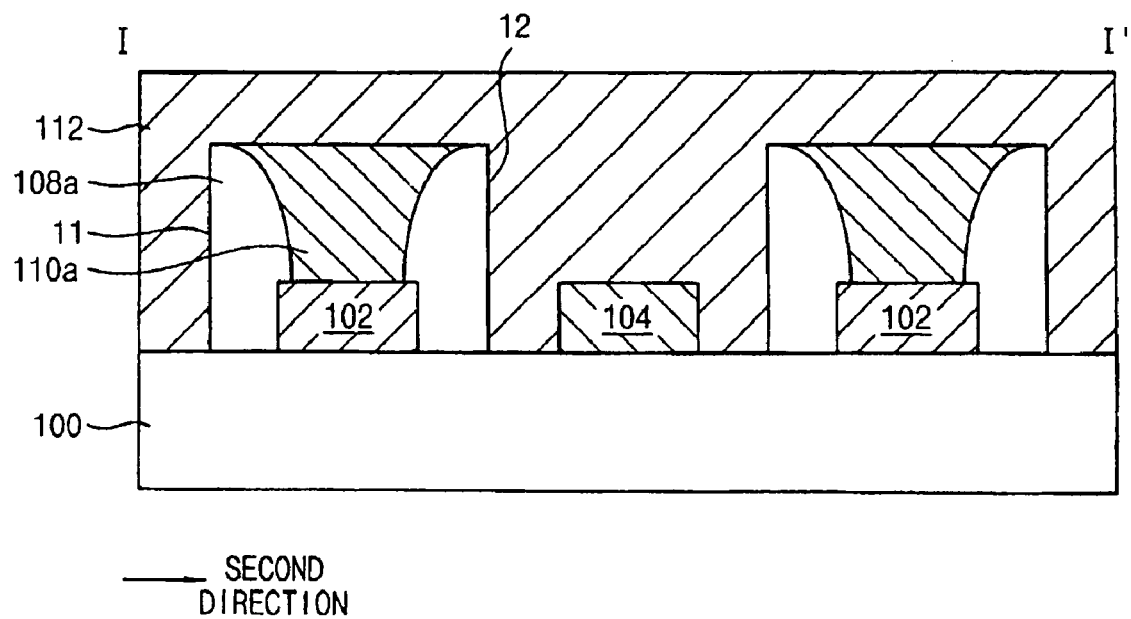
Figure 22:
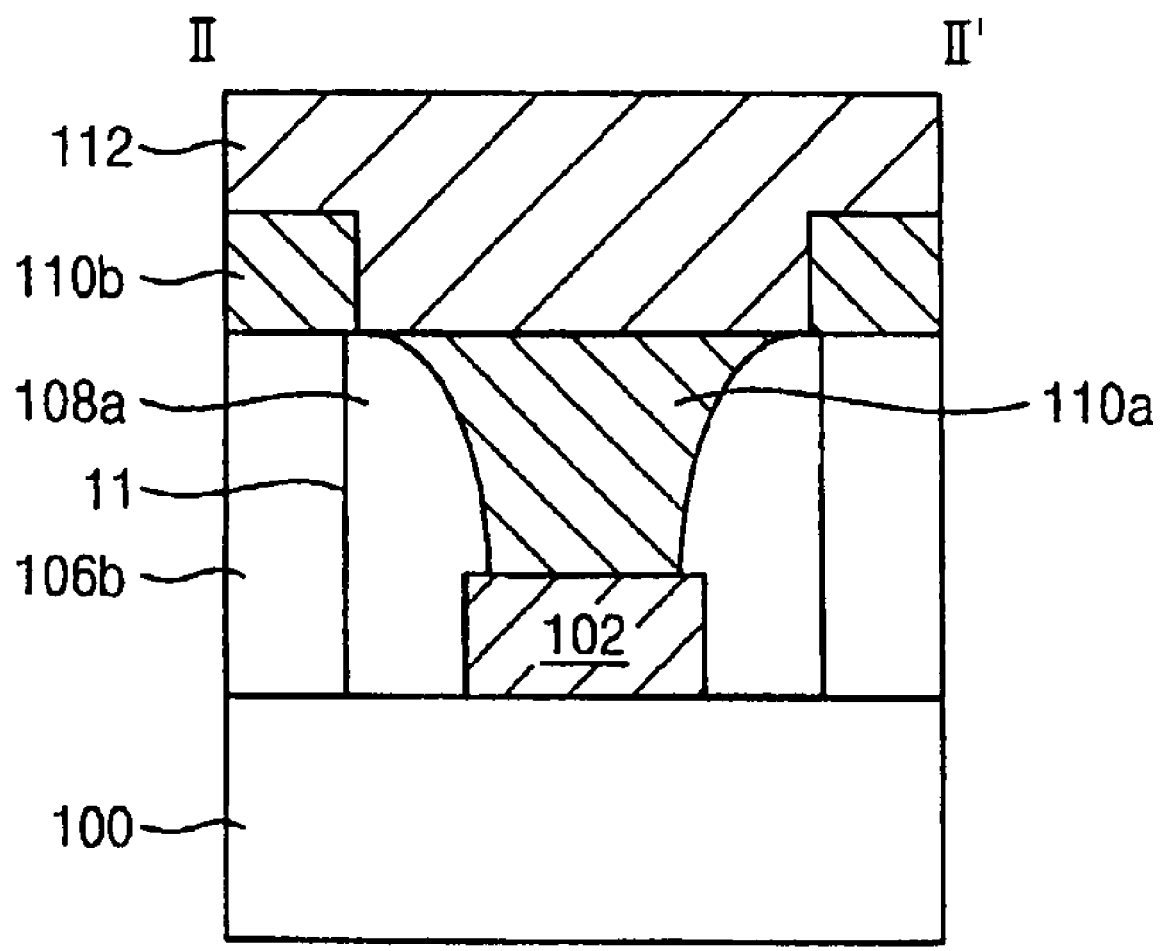

Referring to FIGS. 20, 21 and 22, a second conductive layer 112 filling the second hole 12 may be formed on the lower structure 100, the second conductive structure 104, the first contact 110a, the spacer 108a and the remaining pattern 110b. The second conductive layer 112 may be formed using a conductive material, e.g., metal and/or doped polysilicon. The second conductive layer 112 may be formed by a chemical vapor deposition process and/or a physical vapor deposition process.

Figure 23:
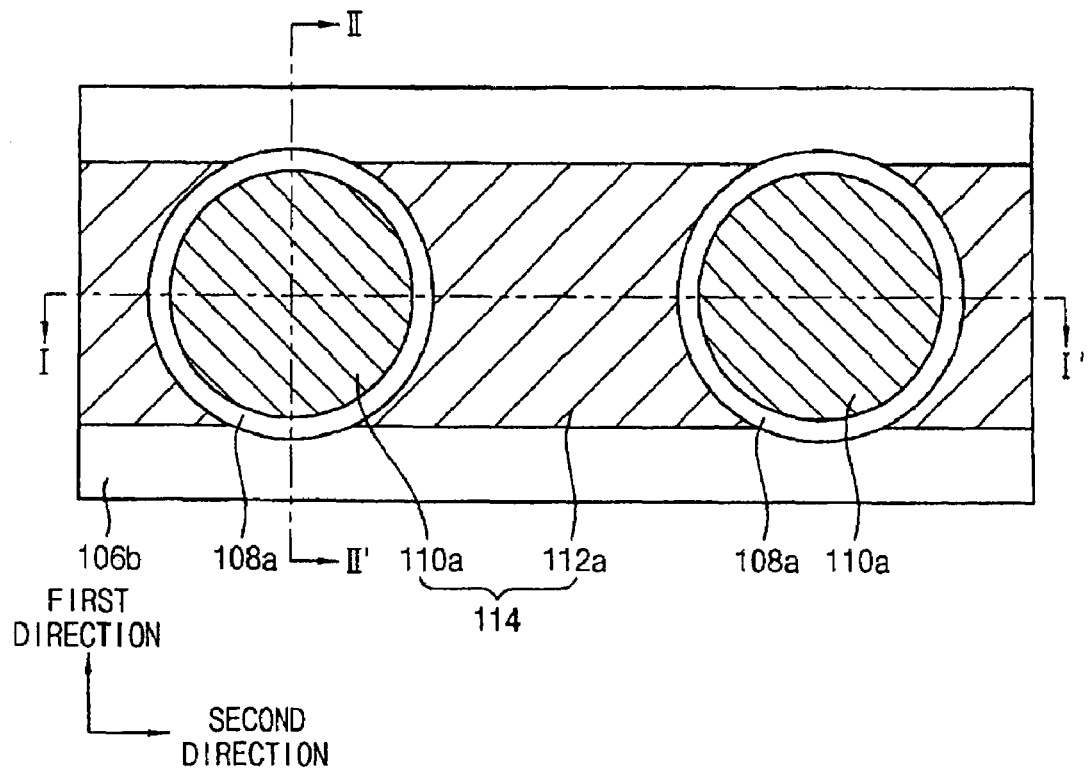
Figure 24:
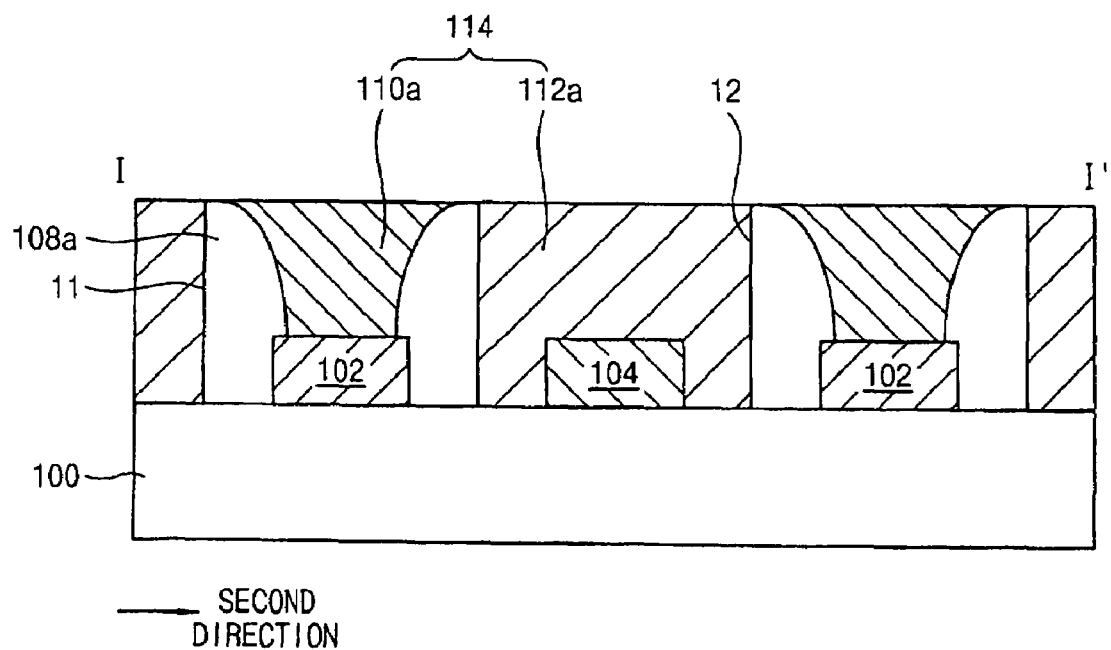
Figure 25:
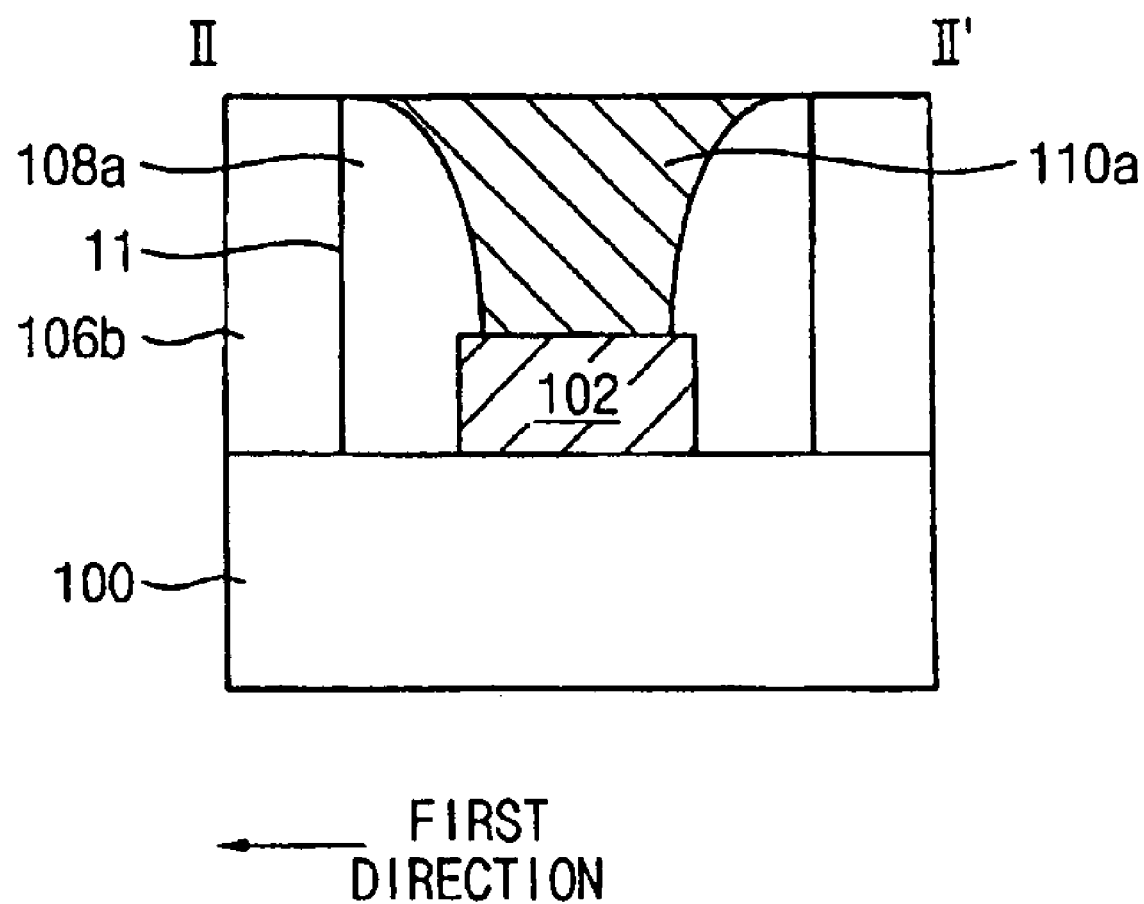

Referring to FIGS. 23, 24 and 25, a planarization process, e.g., a chemical mechanical process and/or an etch-back process, may be performed on the second conductive layer 112 until the first insulating layer pattern 106b is exposed. An upper portion of the second conductive layer 112 may be removed by the planarization process so that the second conductive layer 112 may be transformed into a second contact 112a filling the second hole 12. The remaining pattern 110b may be removed from the first insulating layer pattern 106b by the planarization process. A contact structure 114 may include the first contact 110a filling the first hole 11 to be electrically coupled to the first conductive structure 102 and the second contact 112a filling the second hole 12 to be electrically coupled to the second conductive structure 104. The first and second contacts 110a and 112a included in the contact structure 114 may be insulated from each other by the spacer 108a.

Figure 26:
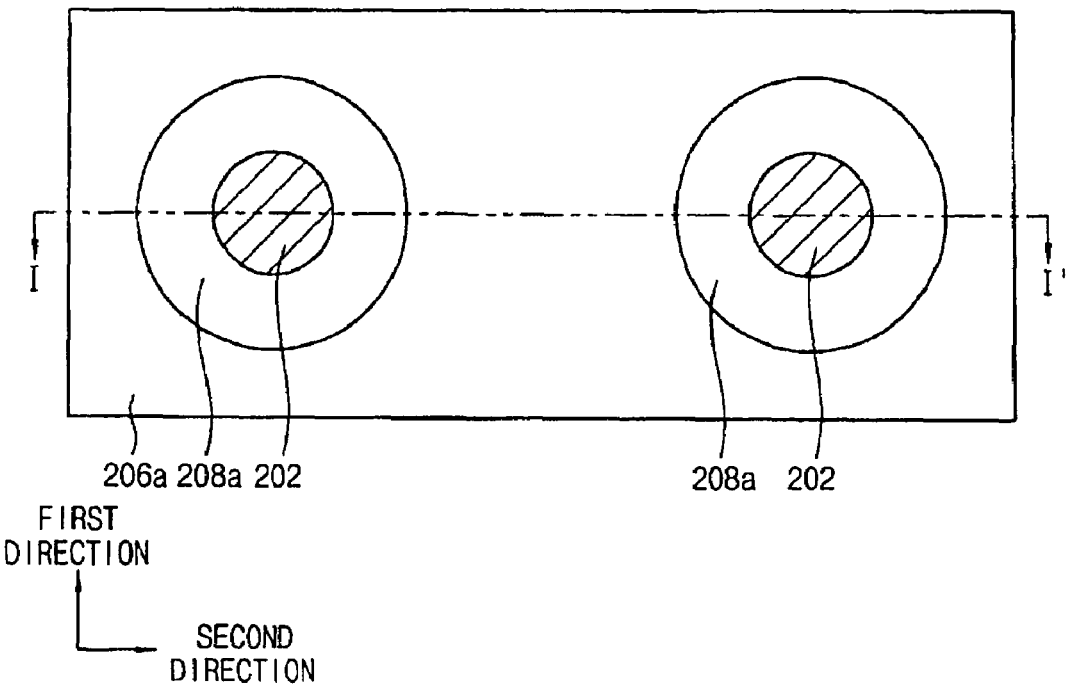
Figure 27:
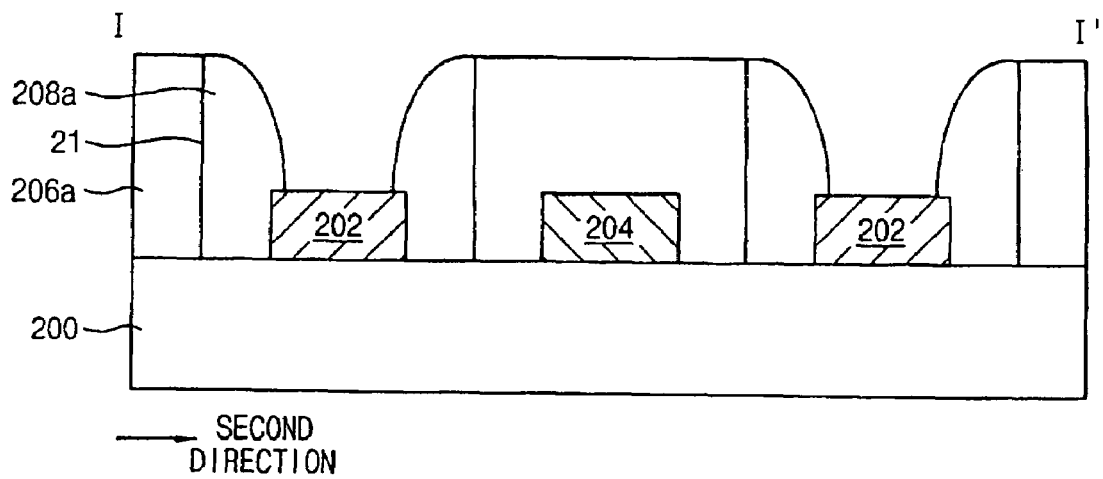

FIGS. 26, 28, 31, 34, 37 and 40 are plan views illustrating a method of forming a contact structure in accordance with example embodiments. FIGS. 27, 29, 32, 35, 38 and 41 are cross-sectional views taken along lines I-I' in FIGS. 26, 28, 31, 34, 37 and 40, respectively. FIGS. 33, 36 and 42 are cross-sectional views taken along lines II-II' in FIGS. 34, 37 and 40, respectively. Referring to FIGS. 26 and 27, processes substantially the same as those illustrated in FIGS. 1 to 10 may be performed. A lower structure 200, a first conductive structure 202, a second conductive structure 204, a preliminary first insulating layer pattern 206b having a first hole 21 and a spacer 208a may be formed.

Figure 28:
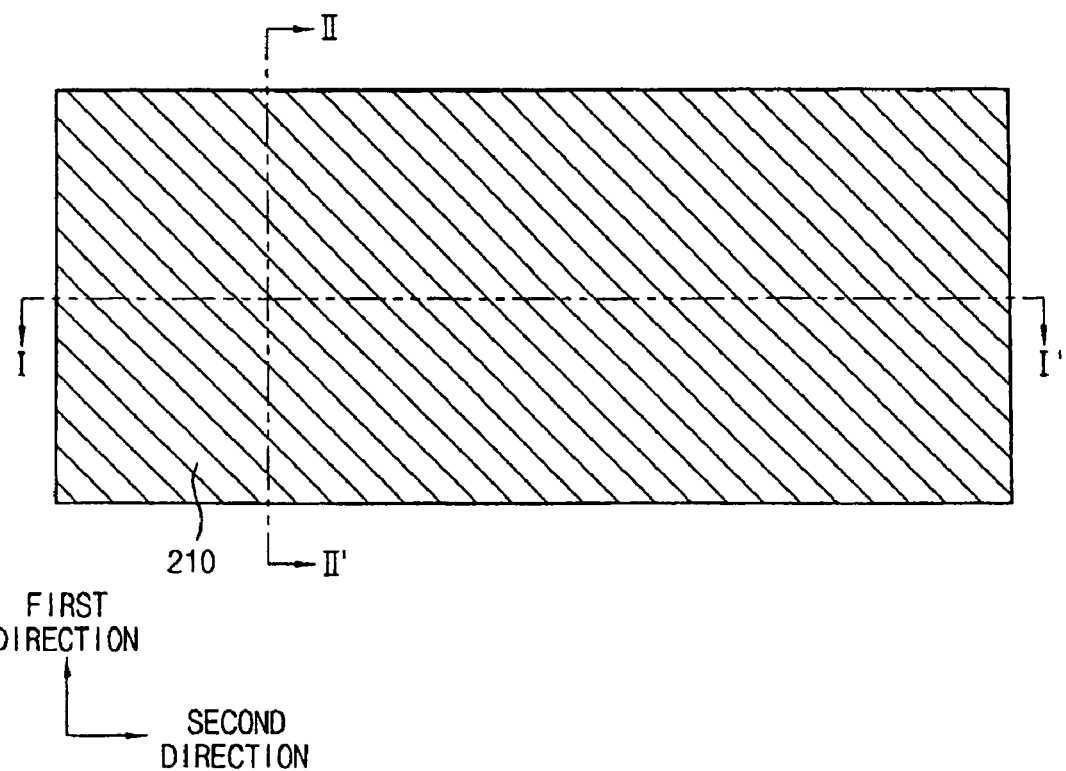
Figure 29:
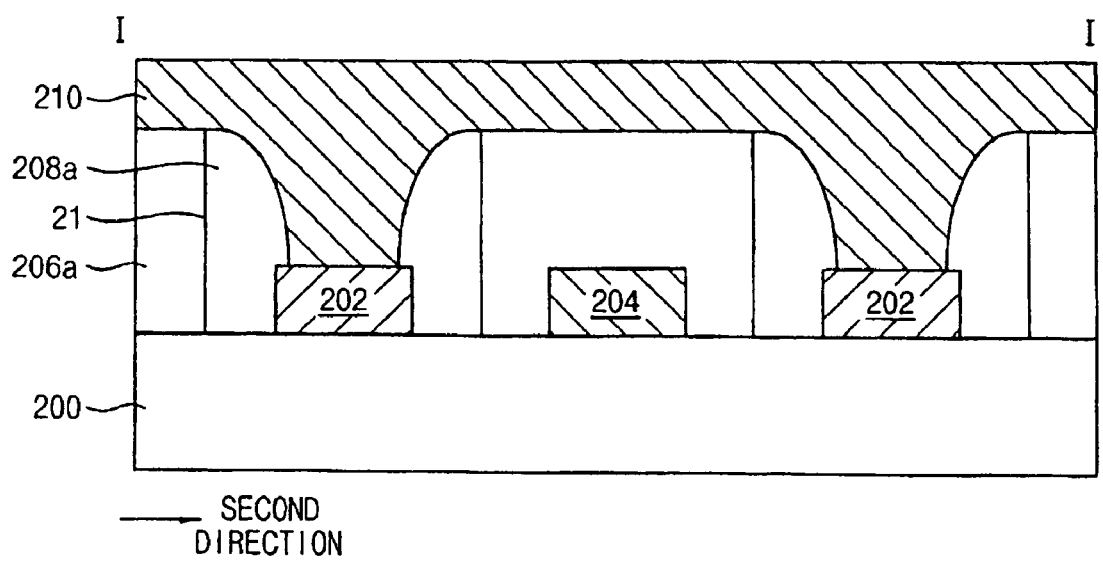
Figure 30:
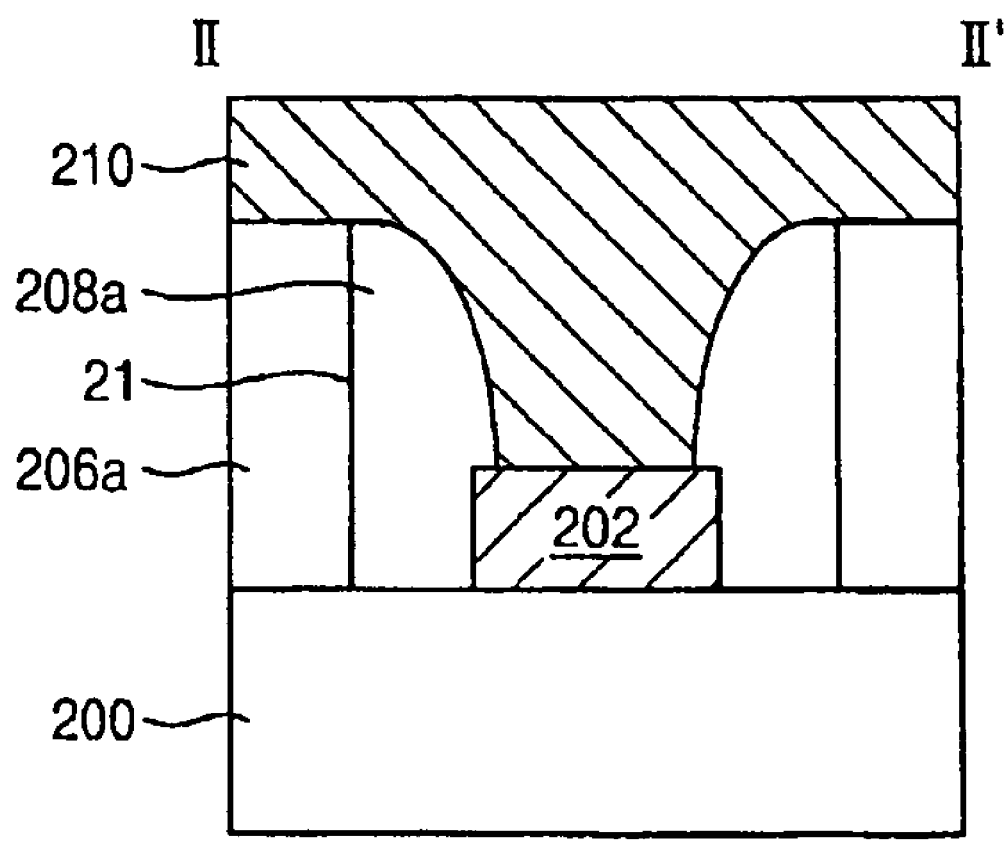

The lower structure 200, the first conductive structure 202, the second conductive structure 204, the preliminary first insulating layer pattern 206b and the spacer 208a illustrated in FIGS. 26 and 27 may be respectively the same as the lower structure 100, the first conductive structure 102, the second conductive structure 104, the preliminary first insulating layer pattern 106a and the spacer 108a in FIGS. 9 and 10. Any further explanation will be omitted. Referring to FIGS. 28, 29 and 30, a first conductive layer 210 filling the first hole 21 may be formed on the preliminary first insulating layer pattern 206b, the spacer 208a and the first conductive pattern 202. The first conductive layer 210 may include a conductive material, e.g., metal and/or doped polysilicon. For example, the first conductive layer 210 may be formed using a physical deposition process and/or a chemical vapor deposition process.

Figure 31:
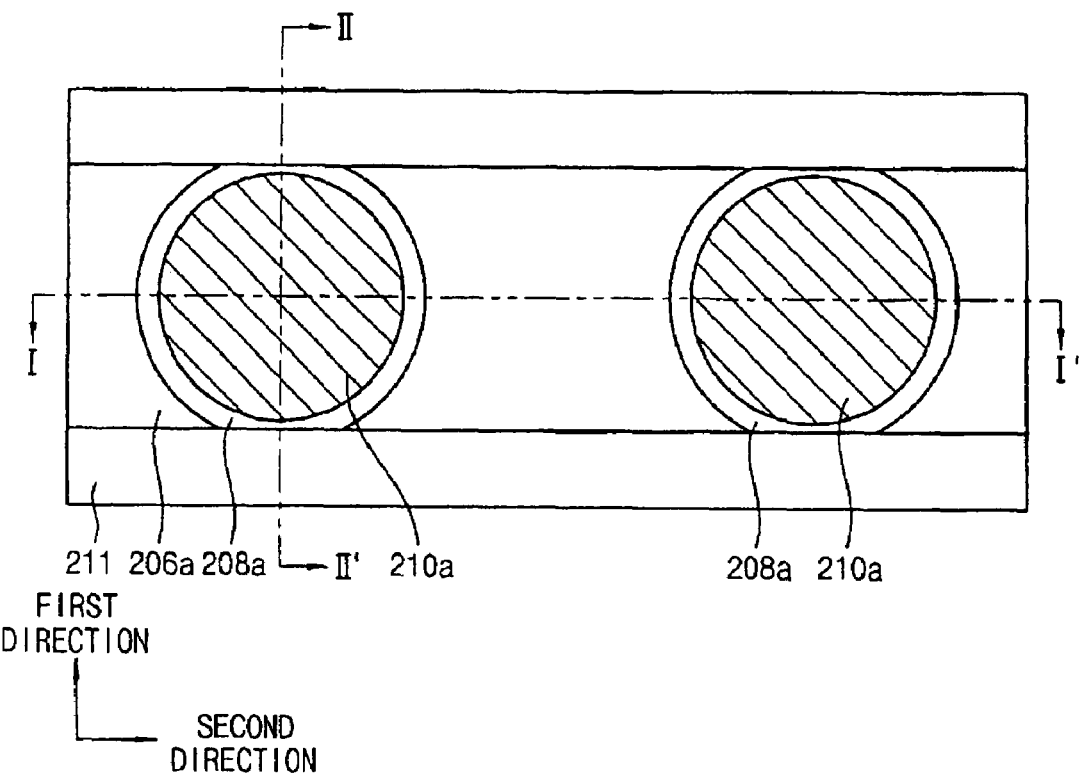
Figure 32:
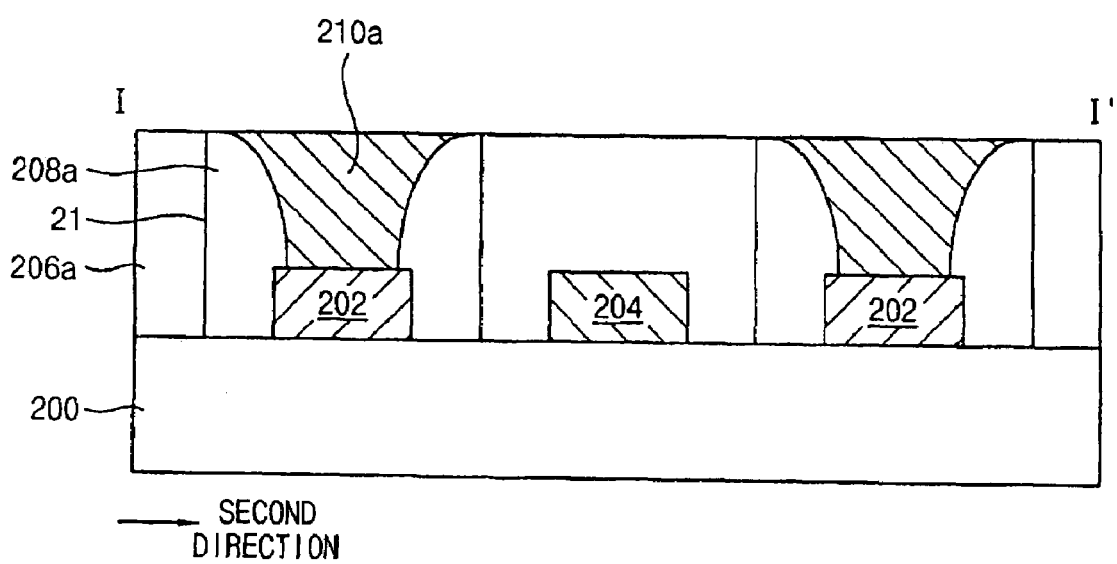
Figure 33:
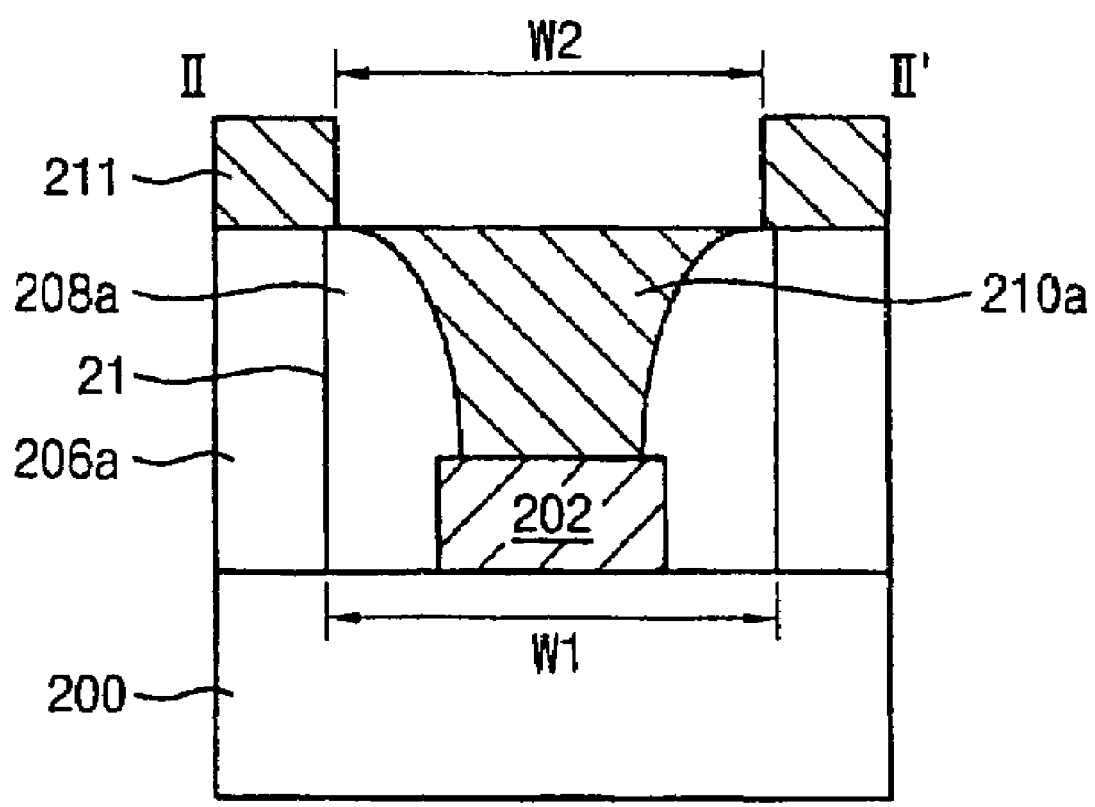

Referring to FIGS. 31, 32 and 33, a planarization process may be performed on the first conductive layer 110 until the first preliminary insulating layer pattern 206b is exposed. The planarization process may be an etch-back process and/or a chemical mechanical polishing process. These processes may be used alone and/or in a combination thereof. The first conductive layer 210 may be transformed into a first contact 210a by the planarization process. The first contact 210a may fill the first hole 21 that is partially filled with the spacer 208a.

After the first contact 210a is formed, mask layer patterns 211 extending in the second direction may be formed on the preliminary first insulating layer pattern 206b and the spacer 208a. As illustrated in FIG. 33, the mask layer patterns 211 may be spaced apart from each other by a second width W2 substantially smaller than a first width W1 of the first hole 21. The spacer 208a may be located under a sidewall of the mask layer pattern 211.

Figure 34:
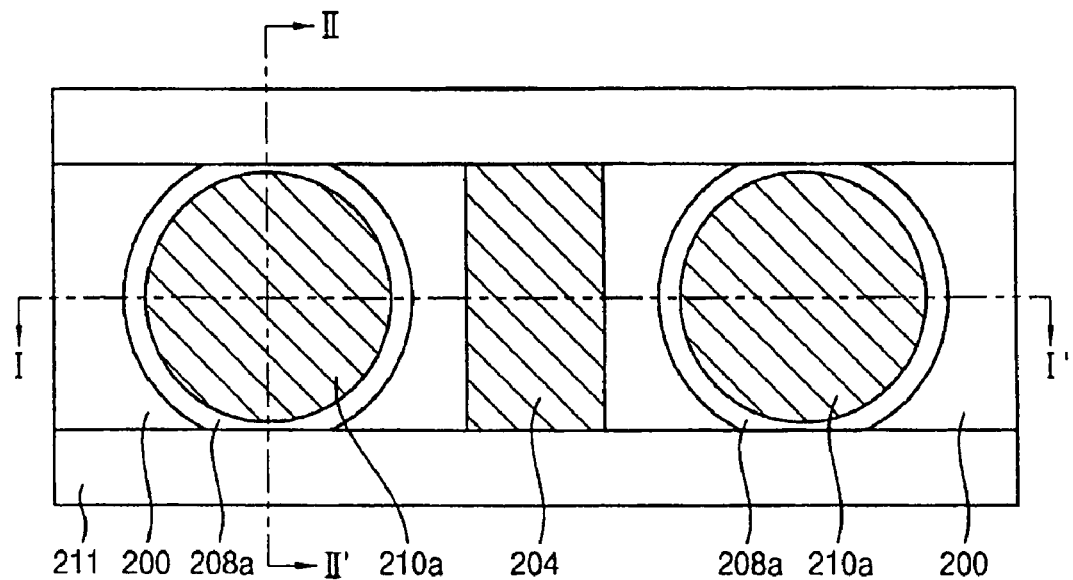
Figure 35:
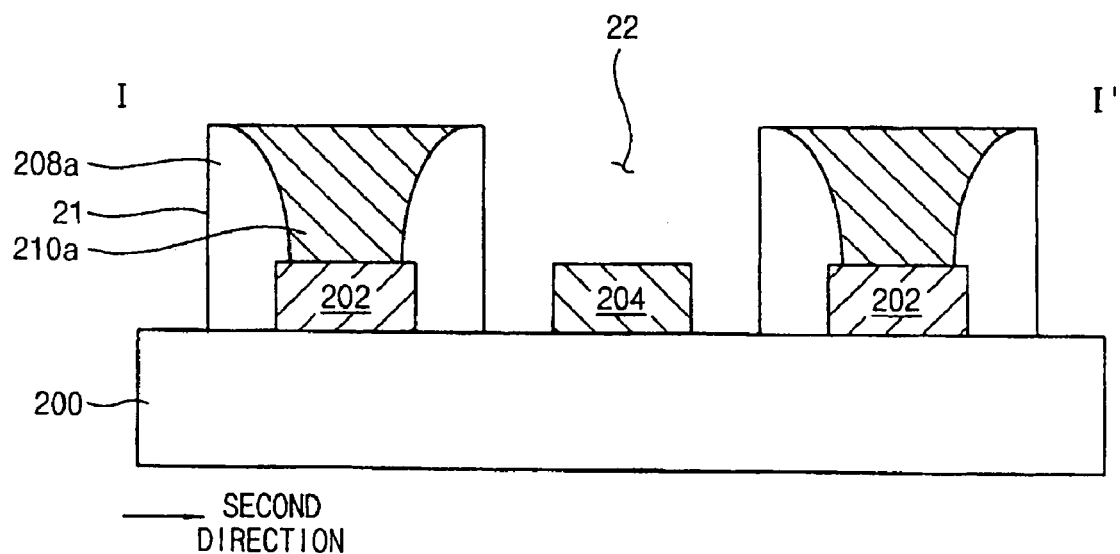
Figure 36:
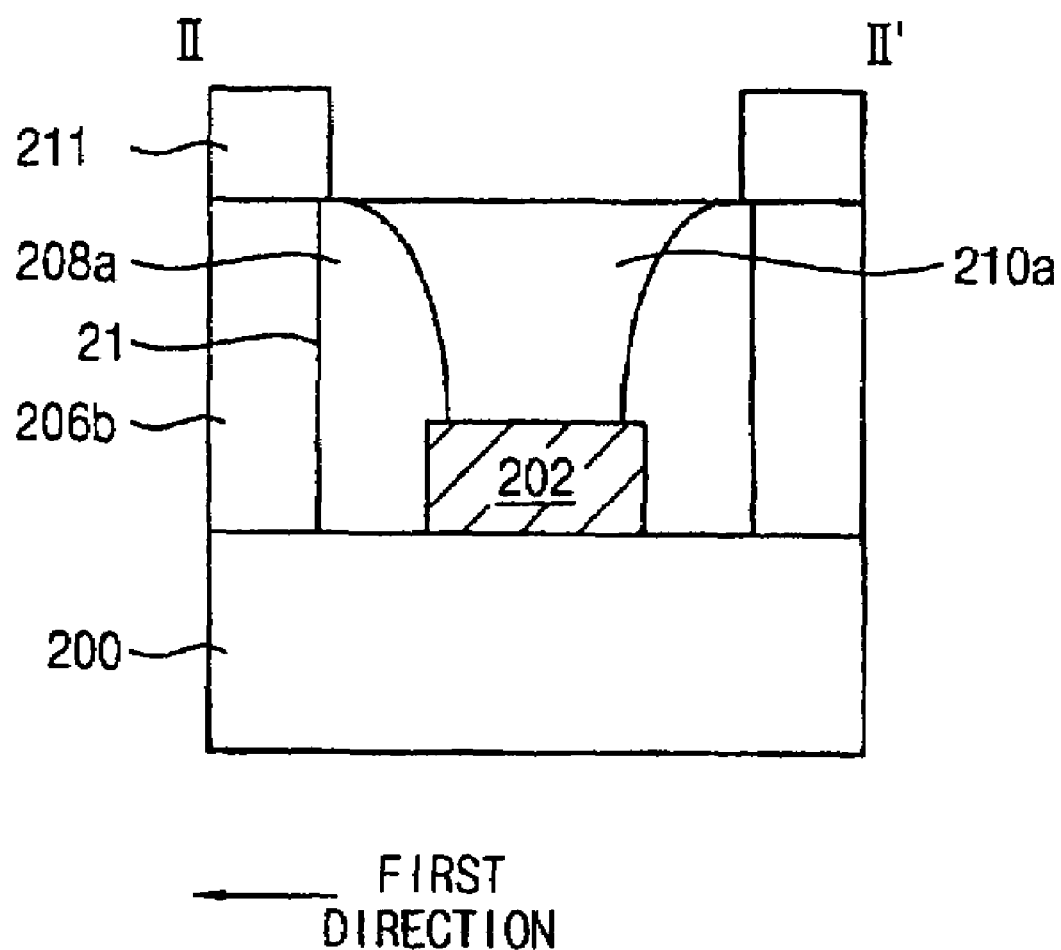

Referring to FIGS. 34, 35 and 36, a portion of the preliminary first insulating layer pattern 206b exposed between the mask layer patterns 211 and between the spacers 208a may be removed until the lower structure 200 and the second conductive pattern 204 are exposed. The preliminary first insulating layer pattern 206b may be transformed into a first insulating layer pattern 206b having a second hole 22. The first insulating layer pattern 206b may be located under the mask layer pattern 211.

Figure 37:
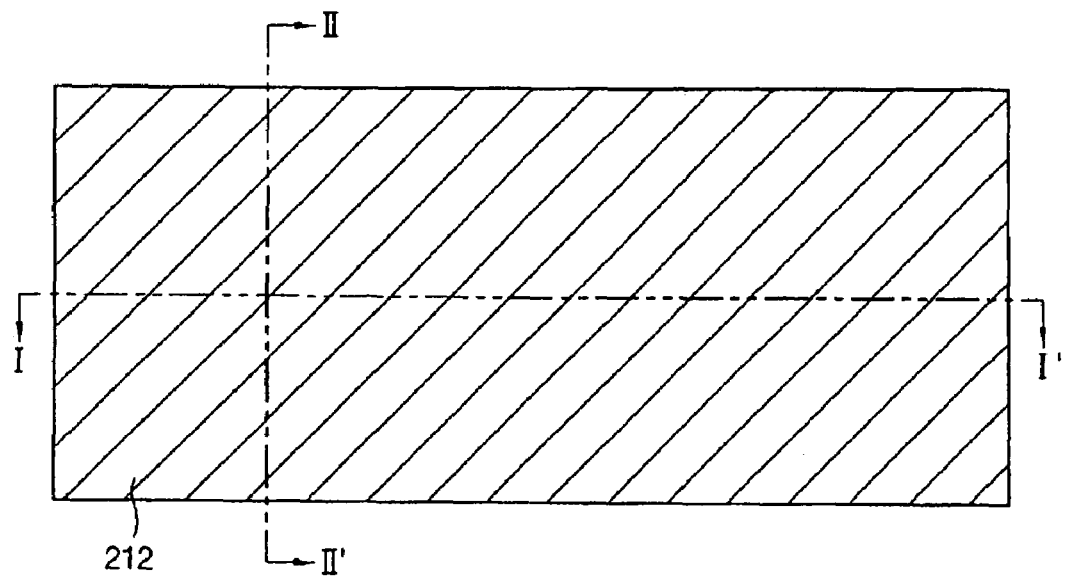
Figure 38:
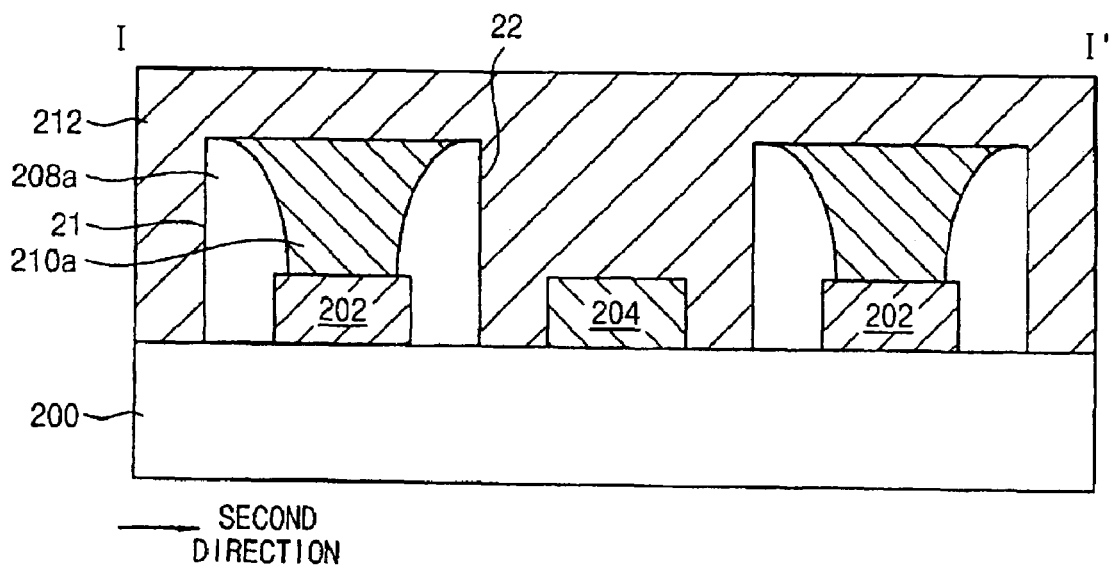
Figure 39:
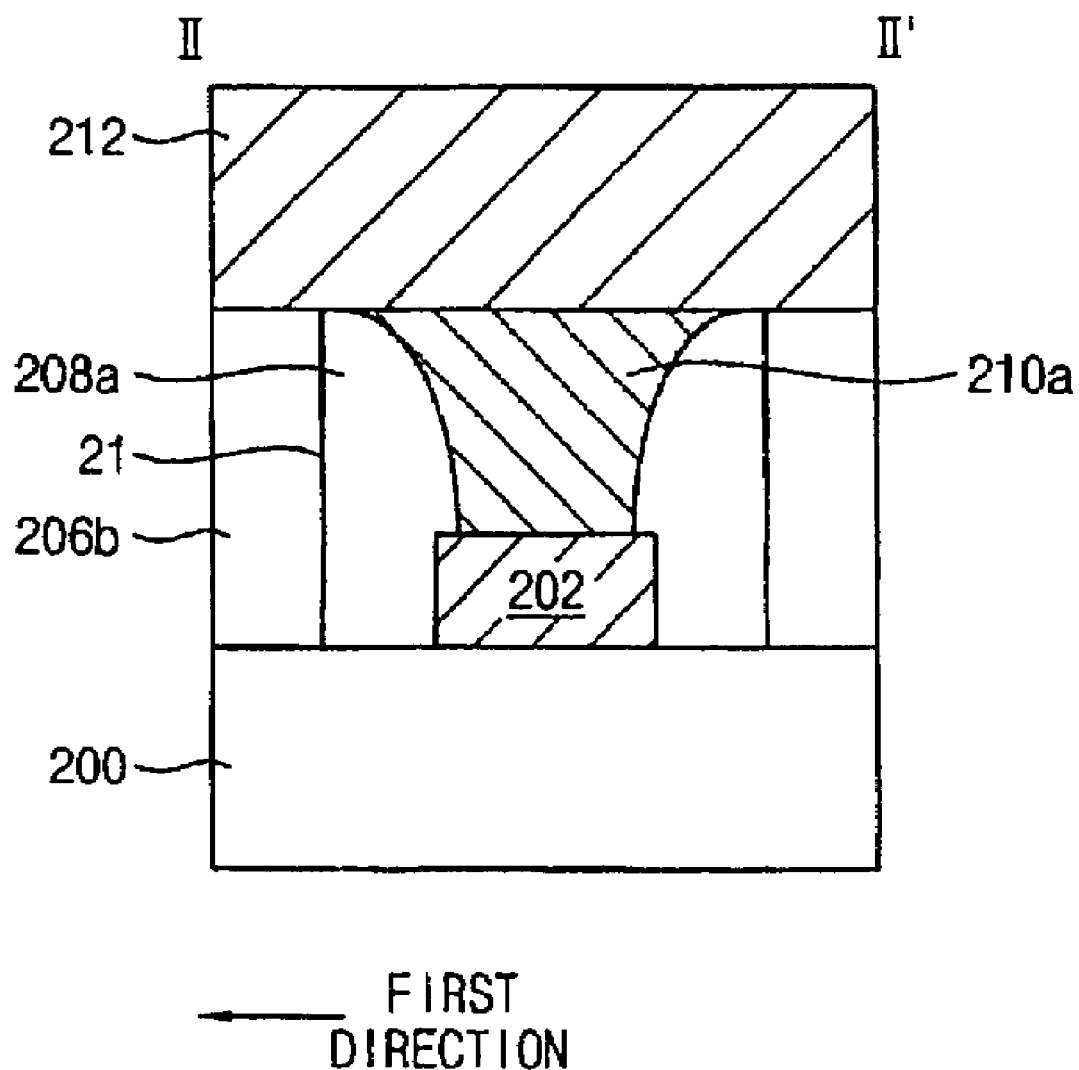

Referring to FIGS. 37, 38 and 39, the mask layer pattern 211 may be removed from the first insulating layer pattern 206b. When the mask layer pattern 211 is a photoresist pattern, the mask layer pattern 211 may be removed by an ashing process and/or a stripping process. A second conductive layer 212 filling the second hole 22 may be formed on the lower structure 200, the second conductive structure 204, the first contact 210a and the spacer 208a. The second conductive layer 212 may include a conductive material, e.g., metal and/or doped polysilicon. The second conductive layer 212 may be formed by a chemical vapor deposition process and/or a physical vapor deposition process.

Figure 40:
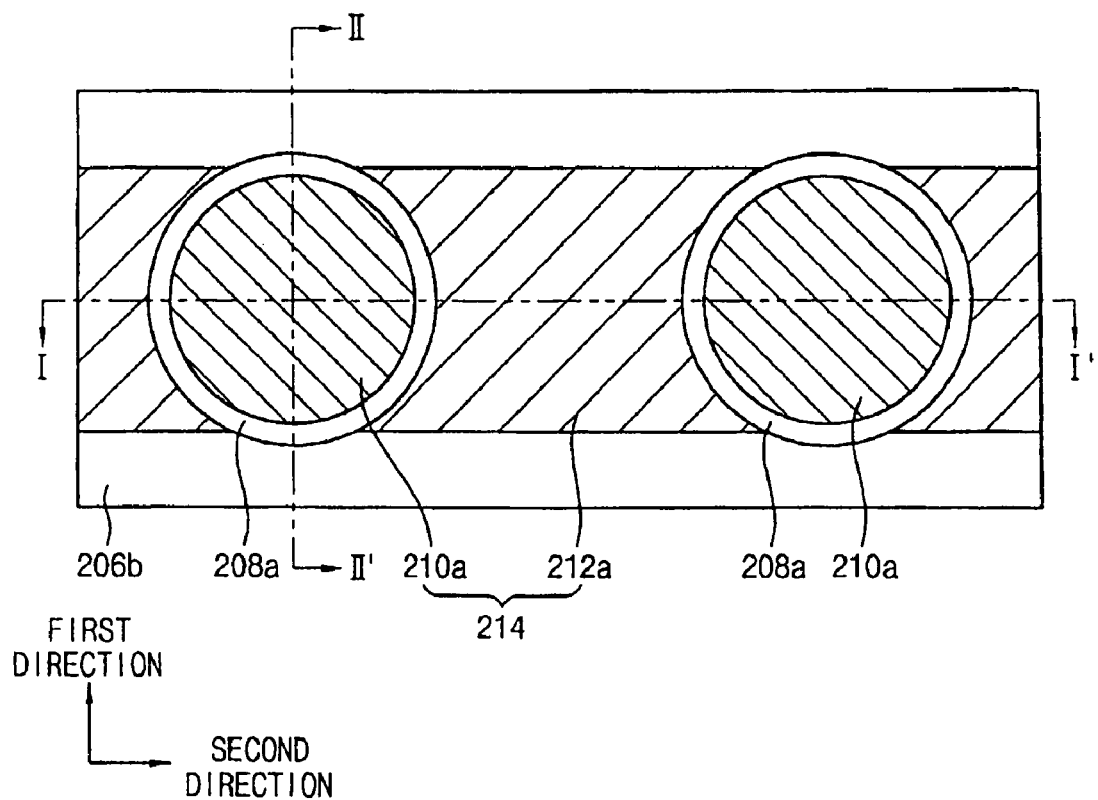
Figure 41:
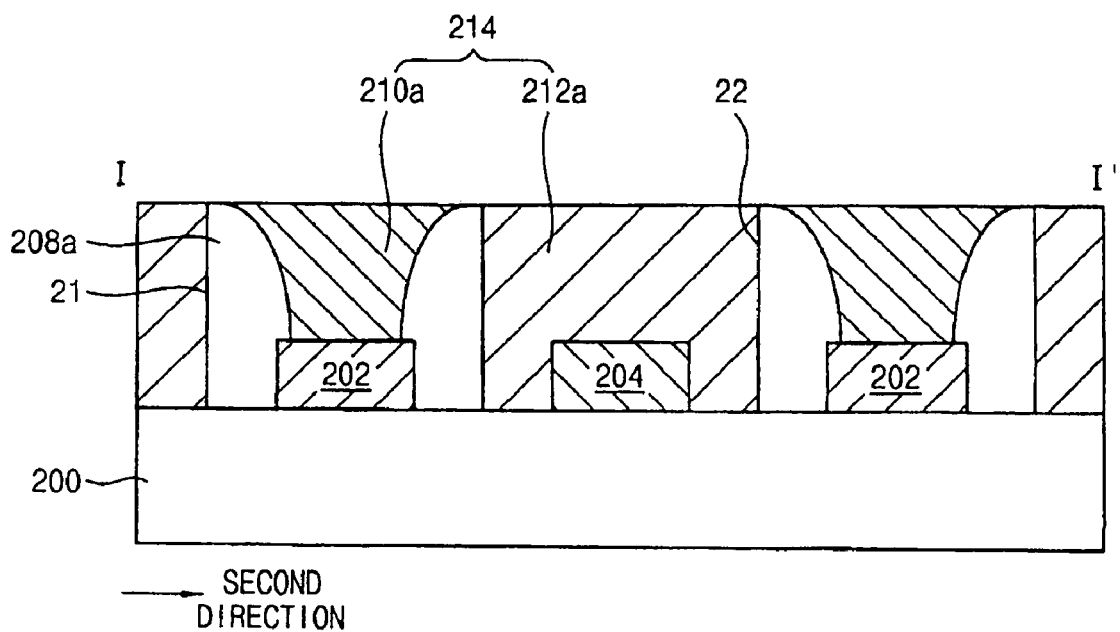
Figure 42:
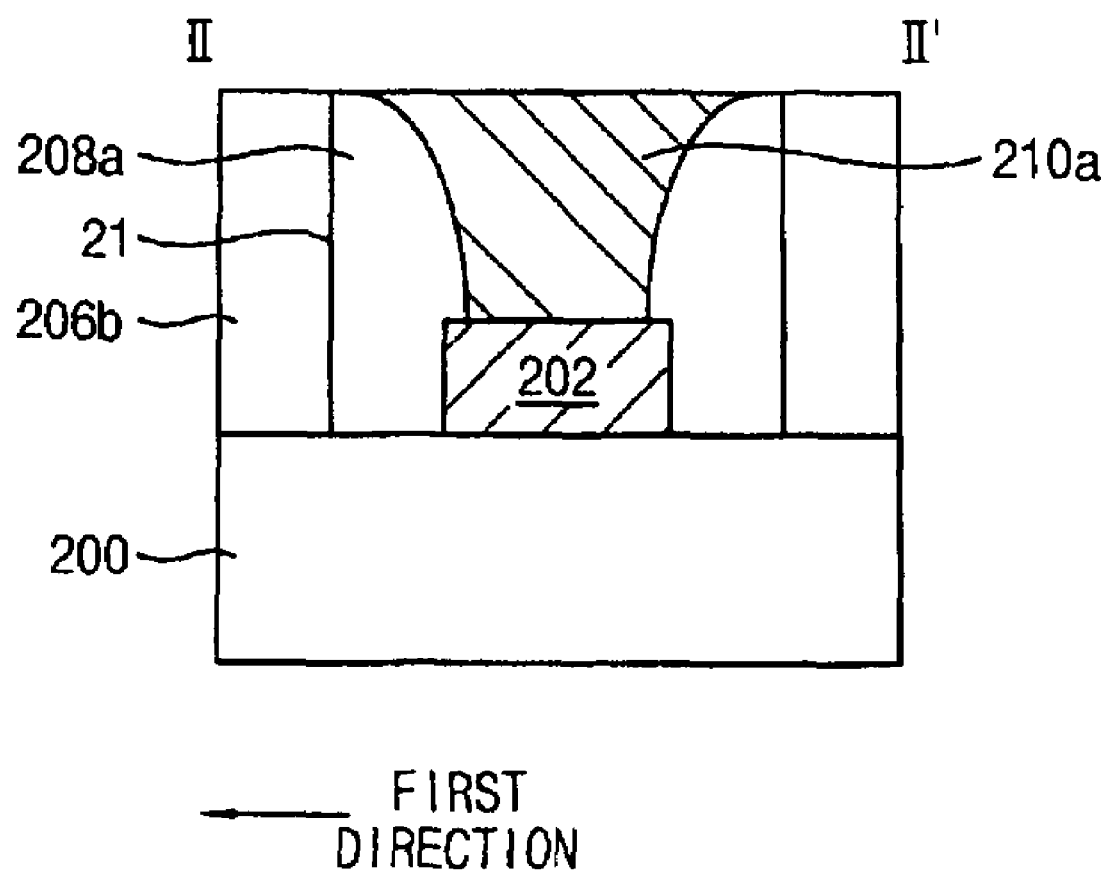

Referring to FIGS. 40, 41 and 42, a planarization process may be performed on the second conductive layer 212 until the first contact 210a, the spacer 208a and the first insulating layer pattern 206b may be exposed. The planarization process may be an etch-back process and/or a chemical mechanical polishing process. These processes may be used alone and/or in a combination thereof. The second conductive layer 212 may be transformed into a second contact 212a filling the second hole 22 by the planarization process.

A contact structure 214 including the first contact 210b filling the first hole 21 to be electrically coupled to the first conductive structure 202 and the second contact 212a filling the second hole 212a to be electrically coupled to the second conductive structure 204 may be formed. The first contact 210a and the second contact 212a included in the contact structure 214 may be electrically insulated from each other by the spacer 208a.

According to example embodiments, a contact structure may include a first contact and a second contact. To form the contact structure, the first contacts having sidewalls, on which spacers are formed, may be formed. The second contact electrically insulated by the spacer may be formed between the first contacts. A distance between the first contact and the second contact may be efficiently minimized or reduced.

The foregoing is illustrative of example embodiments and is not to be construed as limiting thereof. Although a few example embodiments have been described, those skilled in the art will readily appreciate that many modifications are possible in the embodiments without materially departing from the novel teachings and advantages of example embodiments. Accordingly, all such modifications are intended to be included within the scope of example embodiments as defined in the claims. It is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of forming a contact structure, the method comprising:
    forming first and second conductive structures on a lower structure, the first conductive structures being spaced apart from one another in a first direction, the second conductive structure being formed between the first conductive structures;
    forming a first insulating layer on the lower structure, the first insulating layer covering the first and second conductive structures;
    transforming the first insulating layer into a preliminary first insulating layer pattern having first holes each exposing the first conductive structures;
    forming spacers on inner walls of the first holes;
    forming first contacts in the first holes having the inner walls on which the spacers are formed, the first contacts being electrically connected to the first conductive structures;
    transforming the preliminary first insulating layer pattern into a first insulating layer pattern having a second hole exposing the second conductive structure by removing a portion of the preliminary first insulating layer pattern located between the spacers; and
    forming a second contact in the second hole, the second contact being electrically connected to the second conductive structure,
    wherein forming the second contact includes
        forming a second conductive layer filling the second hole on the lower structure, the second conductive structure, the first contacts, and the spacers, and
        forming the second contact in the second hole by performing a planarization process on the second conductive layer until the first contacts are exposed, and
    wherein forming the first contacts includes
        forming a first conductive layer filling the first holes on the preliminary first insulating pattern, the spacers and the first conductive structures,
        forming mask layer patterns on the first conductive layer, the mask layer patterns extending in the first direction, the mask layer patterns being spaced apart from each other in a second direction substantially perpendicular to the first direction by a width substantially smaller than a width of the first holes such that the spacers are located under a sidewall of the mask layer patterns,
        transforming the first conductive layer into first contacts and remaining patterns by etching the first conductive layer by using the mask layer patterns as an etching mask until the spacers are exposed. the first contacts filling the first holes having the inner walls on which the spacers are formed, the remaining patterns being located under the mask layer patterns, and
        removing the mask layer patterns from the remaining patterns.

2. The method of claim 1, wherein forming the spacers includes:
    forming a second insulating layer on the preliminary first insulating layer pattern, the second insulating layer filling the first holes; and
    anisotropically etching the second insulating layer.

3. The method of claim 1, wherein the spacers covers sidewalls of the first conductive structures, and the spacers electrically insulate the second conductive structure from the first conductive structures.

4. The method of claim 1, wherein the preliminary first insulating layer pattern is transformed into the first insulating layer pattern by removing a portion of the preliminary first insulating layer pattern exposed between the remaining patterns and between the spacers until the lower structure and the second conductive structure are exposed.

5. A method of forming a conductive structure, the method comprising:
    forming first and second conductive structures on a lower structure, the first conductive structures being spaced apart from one another in a first direction, the second conductive structure being formed between the first conductive structures;
    forming a first insulating layer on the lower structure, the first insulating layer covering the first and second conductive structures;
    transforming the first insulating layer into a preliminary first insulating layer pattern having first holes each exposing the first conductive structures;
    forming spacers on inner walls of the first holes;
    forming first contacts in the first holes having inner walls on which the spacers are formed, the first contacts being electrically connected to the first conductive structures;
    transforming the preliminary first insulating layer pattern into a first insulating layer pattern having a second hole by removing a portion of the preliminary first insulating layer pattern located between the spacers, the second hole exposing the second conductive structure; and
    forming a second contact in the second hole, the second contact being electrically connected to the second conductive structure,
    wherein forming the second contact includes
        forming a second conductive layer filling the second hole on the lower structure, the second conductive structures, the first contacts, and the spacers, and
        forming the second contact in the second hole by performing a planarization process on the second conductive layer until the first contacts are exposed,
    wherein forming the first contacts includes
        forming a first conductive layer filling the first holes on the preliminary first insulating layer pattern, the spacers and the first conductive structures, and
        planarizing the first conductive layer until the preliminary first insulating layer pattern and the spacers are exposed, and
    wherein transforming the preliminary first insulating layer pattern into the first insulating pattern includes forming mask layer patterns on the preliminary first insulating layer pattern and the spacers, the mask layer patterns extending in the first direction, the mask layer patterns being spaced apart from each other in a second direction substantially perpendicular to the first direction by a width substantially smaller than a width of the first holes such that the spacers are located under a sidewall of the mask layer patterns, and forming the second hole by removing a portion of the preliminary first insulating layer pattern exposed between the mask layer patterns and between the spacers until the lower structure and the second conductive structure are exposed.

6. The method of claim 5, wherein the inner walls of the first holes are spaced apart from sidewalls of the first conductive structures in the first direction and the second conductive structure is not exposed through the first holes.

7. The method of claim 6, wherein forming the spacers includes:

forming a second insulating layer filling the first holes on the preliminary first insulating layer pattern; and anisotropically etching the second insulating layer;

wherein the spacers fill spaces between the first conductive structures and the inner walls of the first holes.

8. The method of claim 5, wherein forming the second contact further includes:

removing the mask layer patterns from the first insulating layer pattern.

* * * * *